(12) United States Patent
Hamasaki

(10) Patent No.: US 11,672,075 B2
(45) Date of Patent: Jun. 6, 2023

(54) IMAGE FORMING APPARATUS FOR FORMING AN IMAGE ON A RECORDING MATERIAL

(71) Applicant: CANON KABUSHIKI KAISHA, Tokyo (JP)

(72) Inventor: Ryuji Hamasaki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/364,080

(22) Filed: Jun. 30, 2021

(65) Prior Publication Data
US 2022/0015219 A1 Jan. 13, 2022

(30) Foreign Application Priority Data
Jul. 9, 2020 (JP) .............................. JP2020-118718

(51) Int. Cl.
*H05K 1/02* (2006.01)
*H05K 7/20* (2006.01)
*G03G 21/20* (2006.01)
*G03G 21/16* (2006.01)
*G03G 15/00* (2006.01)

(52) U.S. Cl.
CPC ....... *H05K 1/0203* (2013.01); *G03G 21/1619* (2013.01); *G03G 21/206* (2013.01); *H05K 7/20136* (2013.01); *G03G 15/80* (2013.01)

(58) Field of Classification Search
CPC ............. H05K 1/0203; H05K 7/20136; G03G 21/1619; G03G 21/206; G03G 15/80
See application file for complete search history.

(56) References Cited

U.S. PATENT DOCUMENTS

| 2004/0130700 A1* | 7/2004 | Ogi | G03G 15/80 |
| | | | 355/133 |
| 2004/0131378 A1* | 7/2004 | Hattori | G03G 15/80 |
| | | | 399/107 |
| 2006/0024078 A1* | 2/2006 | Matsusaka | G03G 15/80 |
| | | | 399/88 |
| 2007/0207640 A1* | 9/2007 | Kawasaki | G03G 21/1619 |
| | | | 439/76.2 |
| 2013/0136484 A1* | 5/2013 | Takahashi | G03G 21/206 |
| | | | 399/92 |
| 2018/0150024 A1* | 5/2018 | Takahashi | G03G 15/80 |

FOREIGN PATENT DOCUMENTS

| JP | 2009122452 | * | 6/2009 |
| JP | 2009122452 A | | 6/2009 |
| JP | 2012164743 A | | 8/2012 |
| JP | 2016020932 A | | 2/2016 |
| JP | 2017136759 A | | 8/2017 |

* cited by examiner

Primary Examiner — Sandra Brase
(74) Attorney, Agent, or Firm — Canon U.S.A., Inc. IP Division

(57) ABSTRACT

An apparatus includes first and second frames disposed to support a forming unit, an outer surface member for covering the first frame, and a circuit board disposed between the first frame and the outer surface member. The circuit board includes a printed board, a first electronic component disposed on a mounting surface of the printed board, and a second electronic component that is smaller than the first electronic component and disposed on the mounting surface of the printed board. The circuit board is disposed so that the mounting surface faces the first frame and extends in a direction that intersects with a plane of the outer surface member.

22 Claims, 14 Drawing Sheets

IMAGE FORMING APPARATUS FOR FORMING AN IMAGE ON A RECORDING MATERIAL

BACKGROUND OF THE DISCLOSURE

Field of the Disclosure

The aspect of the embodiments relates to an image forming apparatus that forms an image on a recording material.

Description of the Related Art

General laser-beam printers (hereinafter referred to as image forming apparatuses) operate on electric power and include electronic circuit boards provided with electronic components for image forming operations. Electronic circuit boards include a power supply board (low-voltage power supply board) for distributing input power at a suitable voltage and a suitable current to each portion, a controller board for managing operations, and a sensing board for performing sensing. Of these boards used in an image forming apparatus, the power supply board is often provided with relatively large-sized electronic components and therefore may require a wide space and shielding to avoid short circuit with electrical conductors disposed around the components. The power supply board is known to be provided with a frame along the front surface and other thin sheet metals along the rear surface to control noise. Thus, the image forming apparatus increases in size depending on the layout of the power supply board.

In a known technique, a frame is formed by a right side plate and a paper supply unit frame, the side face of the paper supply unit frame is disposed on the inner side (cassette side) of the side face of the right side plate, and a relatively large-sized component of a power source unit, such as a transformer, is disposed at a position facing a second side face as discussed in Japanese Patent Application Laid-Open No. 2016-20932. Projections of the power source unit are suppressed in this way. At the same time, it is proposed to prevent an unnecessary space from being produced between the second side face and a cassette and effectively utilize the space in the apparatus.

However, by forming the frame with the right side plate and the paper supply unit frame and disposing electronic components toward the inside of the image forming apparatus, the image forming apparatus can be reduced in size. However, this arrangement increases the complexity of the frame configuration. Since a board is disposed to face the outside of the image forming apparatus, an additional thin sheet metal is to be disposed between the board and covers, resulting in a cost increase.

SUMMARY OF THE DISCLOSURE

According to an aspect of the embodiments, an apparatus includes a forming unit configured to form an image on a recording material, a first frame and a second frame disposed to sandwich the forming unit therebetween and support the forming unit, an outer surface member for covering the first frame, and a circuit board disposed between the first frame and the outer surface member. The circuit board includes a printed board, a first electronic component disposed on a mounting surface of the printed board, and a second electronic component that is smaller than the first electronic component and disposed on the mounting surface of the printed board. The circuit board is disposed so that the mounting surface faces the outer surface member and extends in a direction that intersects with a plane of the outer surface member, and a first gap between the first electronic component and the outer surface member is shorter than a second gap between the second electronic component and the outer surface member.

Further features of the disclosure will become apparent from the following description of exemplary embodiments with reference to the attached drawings.

DESCRIPTION OF THE EMBODIMENTS

An exemplary embodiment for embodying the disclosure will be described in detail below with reference to the accompanying drawings. However, sizes, materials, shapes, and relative arrangements of components according to the exemplary embodiment are to be modified as required depending on the configuration of an apparatus according to the disclosure and other various conditions. The scope of the disclosure is not limited to the following exemplary embodiment.

(Image Forming Apparatus)

Figure 1A:
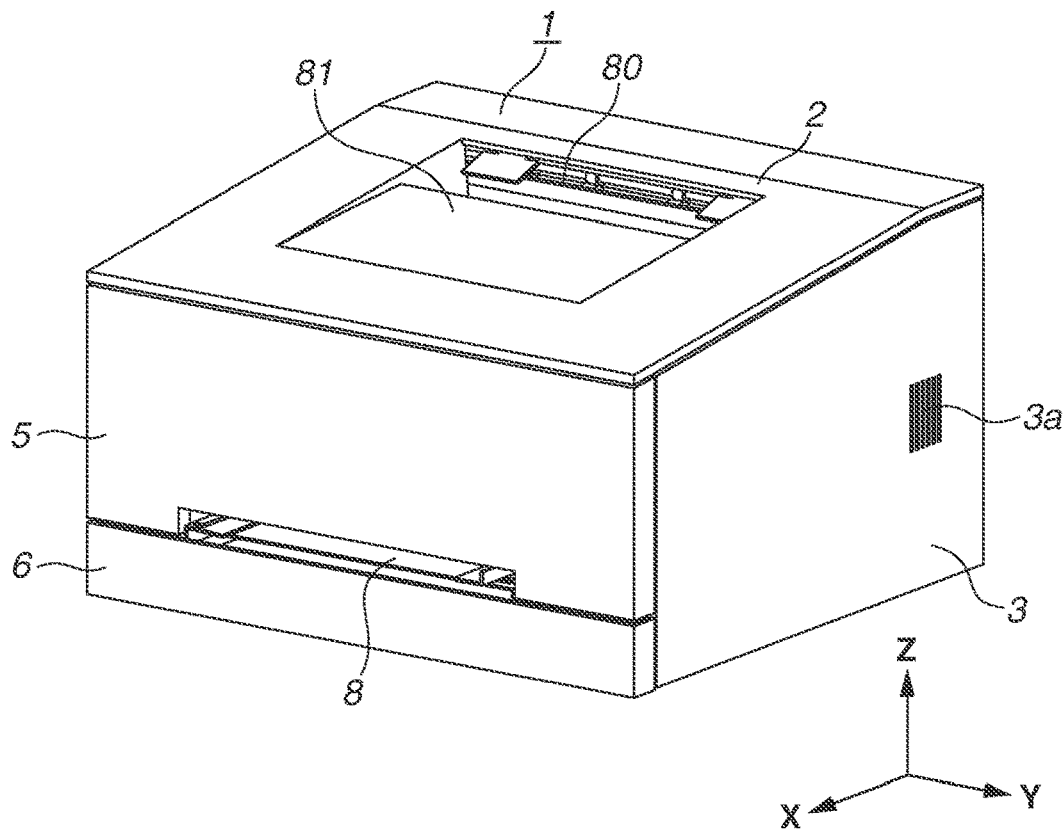
FIGS. 1A and 1B are perspective views each illustrating an image forming apparatus according to an exemplary embodiment.
Figure 1B:
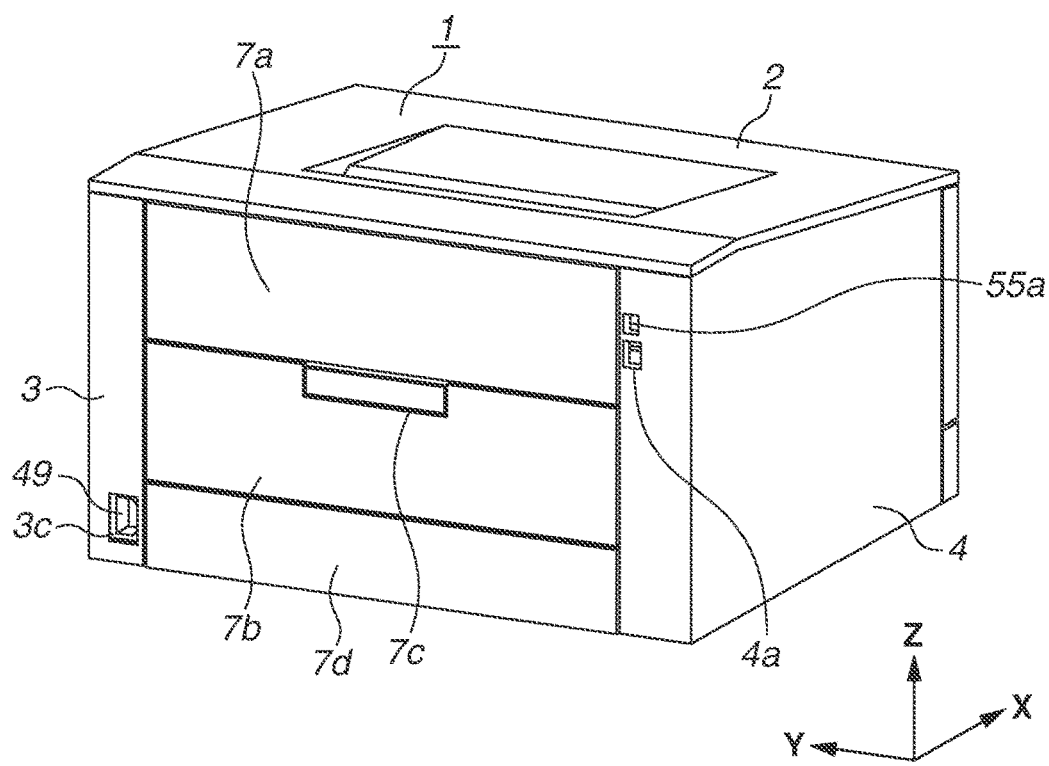

An image forming apparatus will be described below with reference to FIGS. 1A and 1B. FIGS. 1A and 1B are perspective views each illustrating a color laser beam printer, which is an example of an image forming apparatus according to the exemplary embodiment of the disclosure. In FIGS. 1A and 1B, the coordinate axis X is referred to as an anteroposterior direction of the product, the coordinate axis Y is referred to as a widthwise direction of the product, and the coordinate axis Z is referred to a heightwise direction (vertical direction) of the product. The outer surface of the image forming apparatus 1 is formed of a plurality of covers mainly made from non-conductor resin. Non-conductor means not an insulator but a material not having high conductivity, such as metals. Outer surface covers of the image forming apparatus 1 include a top cover 2, a right cover 3 (outer surface member), a left cover 4, a front door 5, and a cassette cover 6. The covers on the rear face include an upper rear cover 7a, a rear door 7b, a rear door handle 7c, and a lower rear cover 7d. The front door 5 is openably and closably provided to the main body of the image forming apparatus 1 to enable the replacement of a cartridge 21. The cassette cover 6 is integrally fixed to a cassette 9 and is insertably and removably provided together with the cassette 9. The rear door 7b is openably and closably provided to the main body of the image forming apparatus 1 to enable jam recovery and internal unit replacement. The top cover 2 is fixed to the main body of the image forming apparatus 1, and is provided with a discharge tray 81 for stacking printed recording materials S, such as paper. The right cover 3 is fixed to the main body of the image forming apparatus 1, and is provided with a suction port 3a, an exhaust port 3b (FIG. 13B), and a power source opening 3c where a power inlet 49 is exposed. A cable connected to an external power source for supplying power, such as receptacles, is connected to the power inlet 49. The left cover 4 is provided with a communication opening 4a that exposes an input/output (I/O) port 55a for insertion and removal of various communication cables from the outside. The fixing, opening and closing, and partition configurations of the covers according to the present exemplary embodiment are to be considered as illustrative and are not limited thereto. Each of the covers may be integrally provided, further partitioned, or openably/closably or fixedly supported. Each opening may be configured by a cover different from the present exemplary embodiment.

Figure 2A:
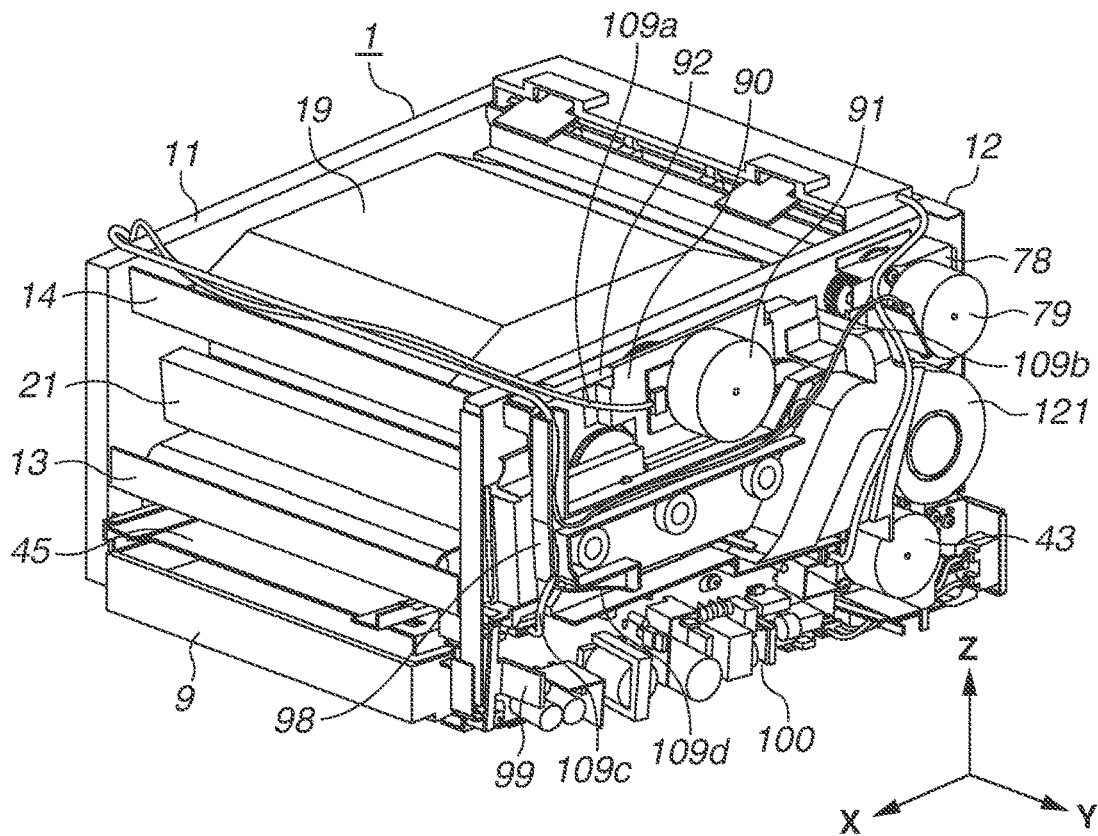
FIGS. 2A and 2B are perspective views each illustrating an internal configuration of the image forming apparatus according to the exemplary embodiment.
Figure 2B:
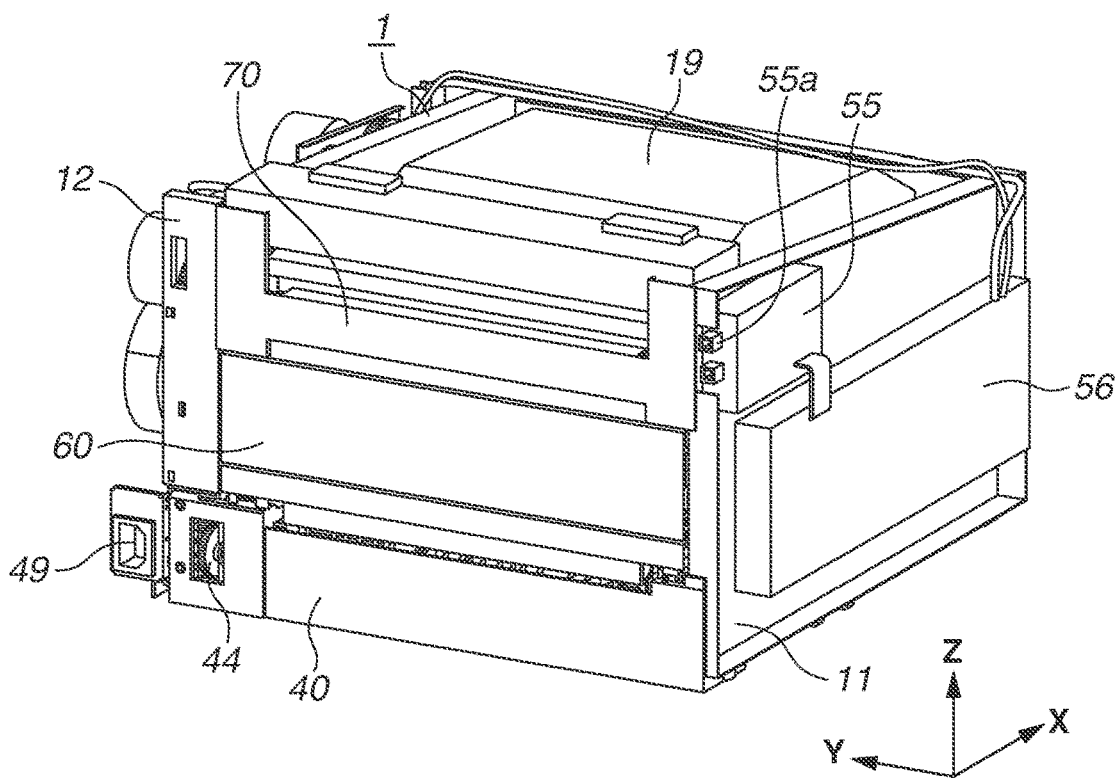
Figure 3:
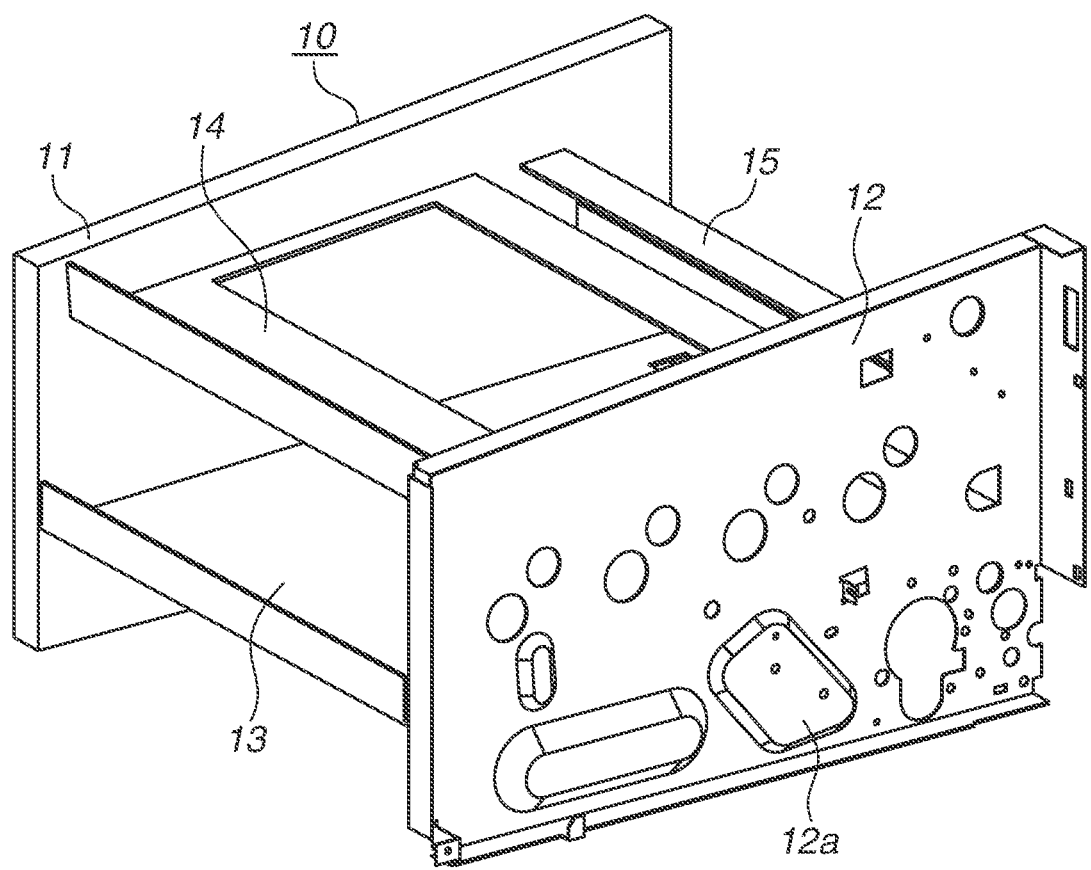
FIG. 3 is a perspective view illustrating a frame according to the exemplary embodiment.

FIGS. 2A and 2B are perspective views each illustrating internal configurations of the image forming apparatus 1 (the covers are not illustrated). FIG. 3 is a perspective view illustrating a configuration of a frame 10 that forms the frame of the image forming apparatus 1. The frame 10 is made of a conductive sheet metal and is formed mainly of a left frame 11 (first frame), a right frame 12 (second frame), a main frame 13, a scanner frame 14, and a fixing frame 15. According to the present exemplary embodiment, the space between the left frame 11 and the right frame 12 is referred to as an in-frame space, and the space outside the left frame 11 and the right frame 12 is referred to as an out-frame space. The main frame 13, the scanner frame 14, and the fixing frame 15 are disposed between the left frame 11 and the right frame 12, and form a part of the frame by the left frame 11 being combined with the right frame 12.

The arrangement and support of each unit in the image forming apparatus will be described below with reference to FIGS. 2A and 2B. A laser scanner 19 is disposed at the upper portion of the scanner frame 14 and is supported by the scanner frame 14. A drive unit 90 is mainly disposed outside the right frame 12 and is supported by the right frame 12. A part of the drive unit 90 penetrates through the hole in the right frame 12 to transmit a driving force to the units disposed in the in-frame space. A power source unit 100 is disposed outside the right frame 12 and below the drive unit 90, and is supported by the right frame 12 and peripheral components. The cassette 9 is disposed in the in-frame space and below the main frame 13. A manual feed unit 8 is divided into an upper and a lower unit with a conveyance path P2 therebetween. The upper unit is supported by the main frame 13. A separation unit 40 is mainly disposed in the in-frame space and is supported by the main frame 13, the right frame 12, and the left frame 11. A supply drive mechanism 44 is disposed on the depth side of the bottom of the right frame 12, and connects the units provided inside and outside the frame 10, across the right frame 12. A primary transfer unit 30 is disposed in the in-frame space, between the main frame 13 and the scanner frame 14, and below the cartridge 21, and is supported by the left frame 11, the right frame 12, and peripheral members (not illustrated). A secondary transfer unit 60 is swingably supported by the left frame 11 and the right frame 12. When the rear door 7b is opened, the secondary transfer unit 60 can be moved to the open position. When the secondary transfer unit 60 moves to the open position, the conveyance path is open to the outside. A fixing unit 70 and a discharge unit 80 are formed as one unit, and are supported on the rear side of the top of the left frame 11 and the right frame 12. A control unit 55 and a high-voltage unit 56 are disposed outside the left frame 11, and are supported by the left frame 11 and peripheral members.

Figure 4:
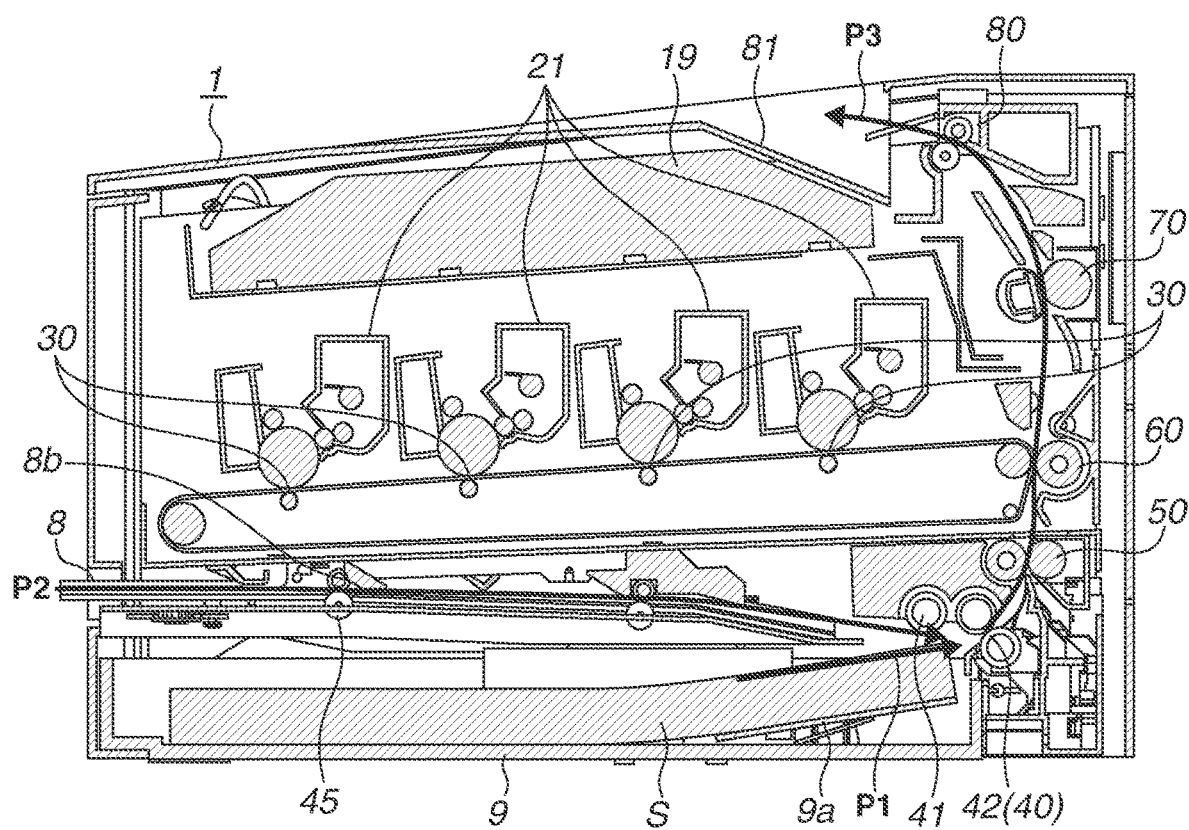
FIG. 4 is a sectional view illustrating an internal configuration of the image forming apparatus according to the exemplary embodiment.

FIG. 4 is a sectional view illustrating the image forming apparatus 1. The image forming apparatus 1 includes a recording material feed unit that includes the cassette 9, the manual feed unit 8, the separation unit 40, a conveyance unit 50, and the discharge unit 80. The image forming apparatus 1 includes two different paths for supplying the recording material S that can be supplied from the cassette 9 and the manual feed unit 8. The image forming apparatus 1 includes a conveyance path P1 from the feed port of the cassette 9, a conveyance path P2 from the manual feed unit 8, and a conveyance path P3 on downstream of the conveyance paths P1 and P2.

(Image Forming Operations on Recording Material S)

Figure 5A:
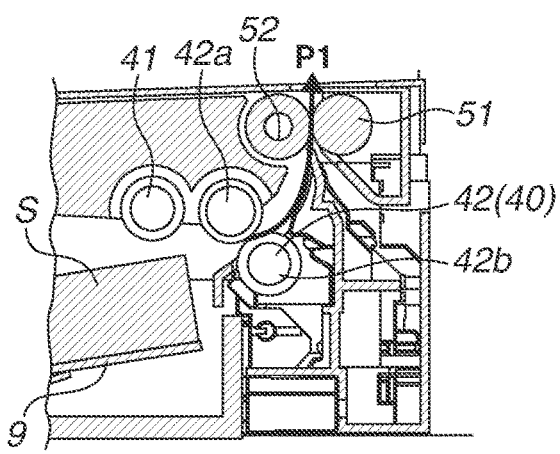
FIGS. 5A to 5D are partial sectional views each illustrating an internal configuration of the image forming apparatus according to the exemplary embodiment.

Image forming operations will be described below. FIG. 5A is a sectional view illustrating the periphery of the separation unit 40 and the conveyance unit 50. The separation unit 40 includes a feed roller 41, a separation roller pair 42, a supply drive motor 43, and a supply drive mechanism 44.

In conveying the recording material S in the cassette 9, the feed roller 41 comes in contact with the uppermost recording material S of the recording materials S stacked on a stacking plate 9a of the cassette 9. Then, the feed roller 41 turns to supply the recording material S to the downstream side. The stacking plate 9a is swingably supported by the cassette 9 and, when the cassette 9 is stored in the image forming apparatus 1, swingably raises the recording material S to the feedable position. The separation roller pair 42 includes a separation conveyance roller 42a and a separation roller 42b. The separation conveyance roller 42a comes in contact with the upper surface of the recording material S and then turns to apply a conveyance force that moves the recording material S to the downstream side. At the same time, the separation roller 42b applies a resistance in the direction opposite to the conveyance direction to the recording material S and subsequent recording materials S so that a plurality of recording materials S is not conveyed to the downstream side. One recording material S can be conveyed to the downstream side by the separation roller pair 42.

According to the present exemplary embodiment, the separation roller 42b is connected with a torque limiter (not illustrated) and separates the recording materials S by the rotational resistance of the torque limiter. However, the aspect of the embodiments is not limited to this separation method used in the separation roller 42b. Examples of applicable methods include a pad separation method using the frictional force by a separation pad, and a retard method in which the separation roller 42b obtains a driving force from the supply drive mechanism 44 and turns in the direction opposite to the rotational direction of the separation conveyance roller 42a, thus performing the separation.

Figure 5C:
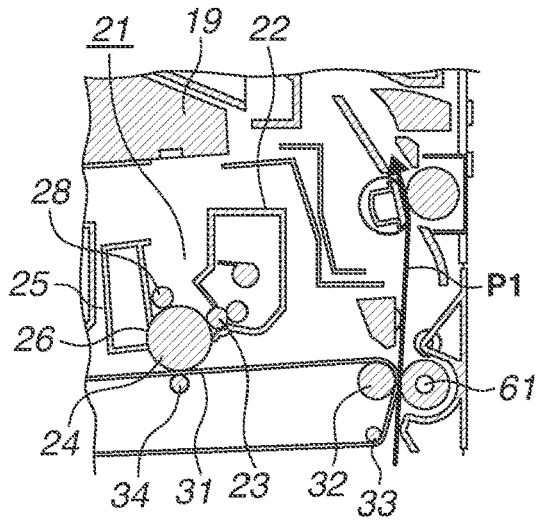
Figure 5B:
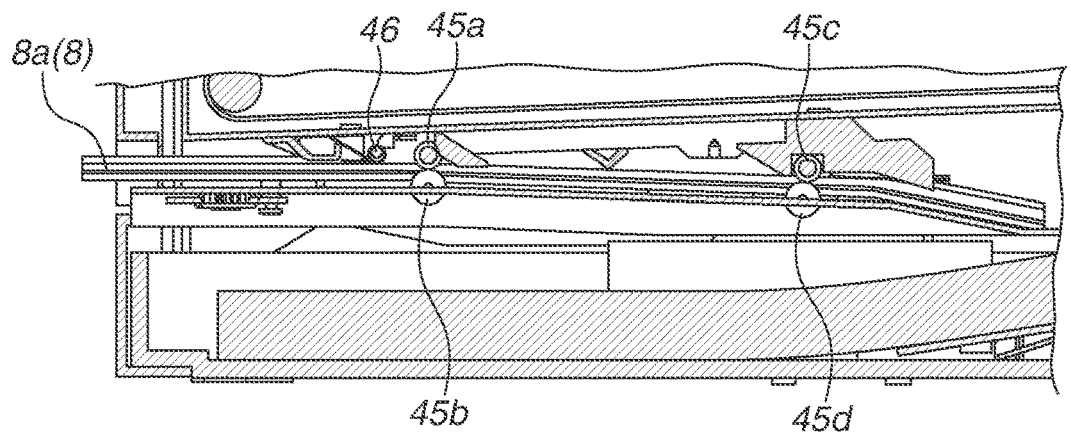

In conveying the recording material S from the manual feed unit 8, the user sets the recording material S in the manual feed unit 8 to enable the recording material S to be conveyed along the conveyance path P2 via a manual feed port 8a. FIG. 5B is a sectional view illustrating the periphery of a manual feed conveyance unit 45 for conveying the recording material S along the conveyance path P2. The manual feed conveyance unit 45 includes an upstream pre-conveyance roller 45a, an upstream pre-conveyance rotatable member 45b, a downstream pre-conveyance roller 45c, a downstream pre-conveyance rotatable member 45d, and a paper detection flag 46. Thus, the paper detection flag 46 is swung by the leading edge of the recording material S, and a paper detection sensor (not illustrated) for detecting the rotation of the paper detection flag 46 detects that the recording material S is inserted into the manual feed port 8a. In response to the paper detection sensor detecting that the recording material S is set in the manual feed unit 8, the upstream pre-conveyance roller 45a and the downstream pre-conveyance roller 45c start turning. When the recording material S is further inserted up to the upstream pre-conveyance roller 45a, the upstream pre-conveyance roller 45a and the upstream pre-conveyance rotatable member 45b facing the upstream pre-conveyance roller 45a pinch the recording material S. Then, the upstream pre-conveyance roller 45a turns to convey the recording material S to the downstream pre-conveyance roller 45c on the downstream side. The downstream pre-conveyance roller 45c and the downstream pre-conveyance rotatable member 45d pinch the recording material S and then convey the recording material S to the separation roller pair 42 on the downstream side. After the recording material S reaches the separation roller pair 42, an operation similar to that performed in the cassette 9 is performed.

The conveyance unit 50 will be described below. The conveyance unit 50 mainly includes a conveyance roller 51, a conveyance rotatable member 52, and a conveyance sensor (not illustrated). The conveyance roller 51 pinches the recording material S supplied from the separation unit 40 with the conveyance rotatable member 52 and then conveys the recording material S to the downstream side. The conveyance sensor detects the leading edge of the recording material S conveyed by the conveyance roller 51 and adjusts (varies) the rotational speed of the conveyance roller 51 so that the position of the image to be transferred at the secondary transfer unit 60 and the position of the recording material S fit into a predetermined range. The conveyance unit 50 obtains the driving force from the supply drive motor 43.

An image forming unit 20 will be described below. The image forming unit 20 mainly includes the laser scanner 19, the cartridge 21, the primary transfer unit 30, and the secondary transfer unit 60. FIG. 5C is a sectional view illustrating the periphery of the image forming unit 20. An image forming process performed by the image forming unit 20 will be described below. The cartridge 21 mainly include a toner holding container 22, a toner supply unit 23, a photosensitive drum 24, a waste toner holding container 25, a cleaning unit 26, and a charge roller 28. The charge roller 28 in the cartridge 21 applies electric charges on the surface of the rotating photosensitive drum 24. The laser scanner 19 suitably irradiates the rotating photosensitive drum 24 with a laser beam. A latent image is formed on the photosensitive drum 24 by the potential difference. The cartridge 21 includes the toner holding container 22 for storing and holding toner, and supplies the toner in the toner holding container 22 from the toner supply unit 23 to the photosensitive drum 24. When the toner is transferred to the latent image on the photosensitive drum 24, a toner image is formed on the photosensitive drum 24. The image forming unit 20 acquires a driving force from a drive motor 91 of the drive unit 90 to turn and operate each unit.

The primary transfer unit 30 mainly includes an intermediate transfer belt 31, a drive roller 32, stretching rollers 33, primary transfer rollers 34, and mechanisms and electrical bias supply structures for operating these components. The intermediate transfer belt 31 is supported by the drive roller 32 and the two stretching rollers 33 so that no slack appears on the intermediate transfer belt 31. Four primary transfer rollers 34 are provided in the inner circumference of the intermediate transfer belt 31. The primary transfer roller 34 is disposed to be changeable between a pressing position at which the primary transfer roller 34 is in pressure contact with the intermediate transfer belt 31 and a separated position at which the primary transfer roller 34 is out of contact with the intermediate transfer belt 31. In the image forming process, when the primary transfer roller 34 is set to the pressing position, the intermediate transfer belt 31 comes in pressure contact with the photosensitive drum 24. When an electrical bias is applied, the toner image on the photosensitive drum 24 is transferred to the intermediate transfer belt 31. Toner images are sequentially transferred from the photosensitive drums 24 of the cartridges 21 for the yellow, magenta, cyan, and black colors to the intermediate transfer belt 31. A color image produced by toner of the four different colors is then formed on the intermediate transfer belt 31. The intermediate transfer belt 31 and the drive roller 32 are also used in the secondary transfer unit 60. After toner has been transferred from a photosensitive drum 24 to the intermediate transfer belt 31, i.e., after the image formation, the toner remaining on the photosensitive drum 24 is scraped down from the photosensitive drum 24 by the cleaning unit 26. The toner scraped down is held in the waste toner holding container 25 as a waste toner storage unit included in the cartridge 21.

The secondary transfer unit 60 includes the intermediate transfer belt 31, the drive roller 32, and a secondary transfer roller 61. The drive roller 32 and the secondary transfer roller 61 pinches the recording material S conveyed from the conveyance unit 50 via the intermediate transfer belt 31 to subject the recording material S to transfer and conveyance processing. When an electrical bias is applied to the secondary transfer roller 61 and the recording material S passes through between the intermediate transfer belt 31 and the secondary transfer roller 61, the toner on the intermediate transfer belt 31 is transferred onto the recording material S, and a toner-based color image is formed on the recording material S.

Figure 5D:
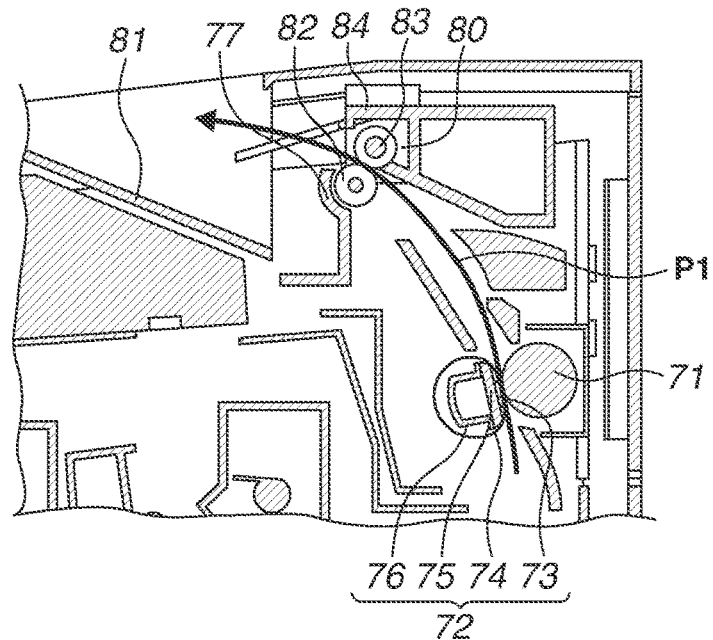

The fixing unit 70 will be described below. FIG. 5D is a sectional view illustrating the periphery of the fixing unit 70 and the discharge unit 80. The fixing unit 70 includes a fixing roller 71 as a pressure roller and a heating unit 72 that faces the fixing roller 71 to form a nip portion. In the fixing unit 70, the fixing roller 71 and the heating unit 72 turn while pinching the recording material S with a color toner image transferred thereon, and the secondary transfer unit 60 applies heat and pressure to the recording material S, thus performing fixing. The heating unit 72 includes a heater 73 serving as a heat source, a fixing film 74, a heater holder 75, and a heater holder support member 76, and raises the temperature of the fixing roller 71 and the heating unit 72. The heater holder 75 supports the heater 73 and rotatably supports the fixing film 74. The heater holder support member 76 supports the heater holder 75. The heating unit 72 includes a fixing temperature detection sensor (not illustrated) that controls the calorific value of the heater so that the nip portion formed by the fixing roller 71 and the heating unit 72 reaches a predetermined temperature. The fixing unit 70 is heated by the heater to a predetermined temperature before the recording material S with an image transferred thereon reaches the fixing unit 70. When the recording material S passes through between the fixing roller 71 and the heating unit 72 the temperature of which has reached the predetermined temperature, the image formed by the toner transferred onto the recording material S is fixed. The predetermined temperature depends on the environment where the apparatus is installed, the paper type, and other diverse conditions. The fixing unit 70 obtains a driving force from a fixing drive motor 79 of a fixing drive unit 78 to turn each component for paper conveyance. The fixing unit 70 includes a fixing cover 77 for shielding the heating unit 72 from the outside.

The discharge unit 80 will be described below. The discharge unit 80 mainly includes a discharge roller 82, a discharge guide 84, and various types of paper detection sensors. The recording material S with an image fixed thereon by the fixing unit 70 is pinched and conveyed by the discharge roller 82 and the discharge rotatable member 83. Various types of paper detection sensors detect the width and the length of the conveyed paper. The discharge tray 81 on the downstream side of the discharge unit 80 stacks the discharged recording material S.

(Power Source Unit)

A configuration of the periphery of the power source unit 100 will be described below. The power source unit 100 is an electronic circuit board (low-voltage power supply board) that supplies power to each unit inside the image forming apparatus 1. The power is supplied from the power inlet 49 to which a cable connected to an external power source, such as receptacles, is connected.

Figure 6A:
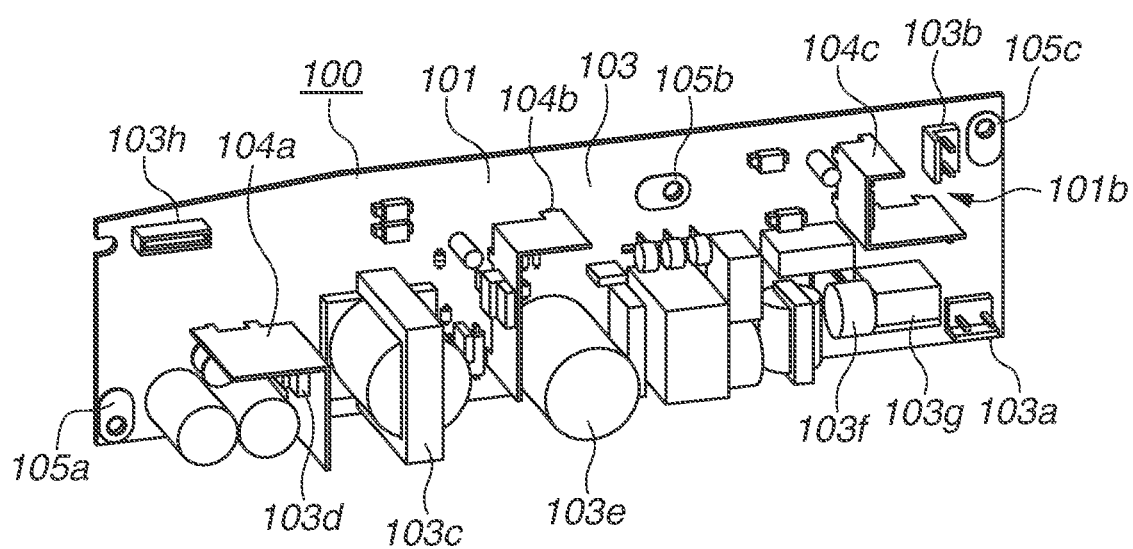
FIGS. 6A and 6B are perspective views each illustrating a power source unit according to the exemplary embodiment.
Figure 6B:
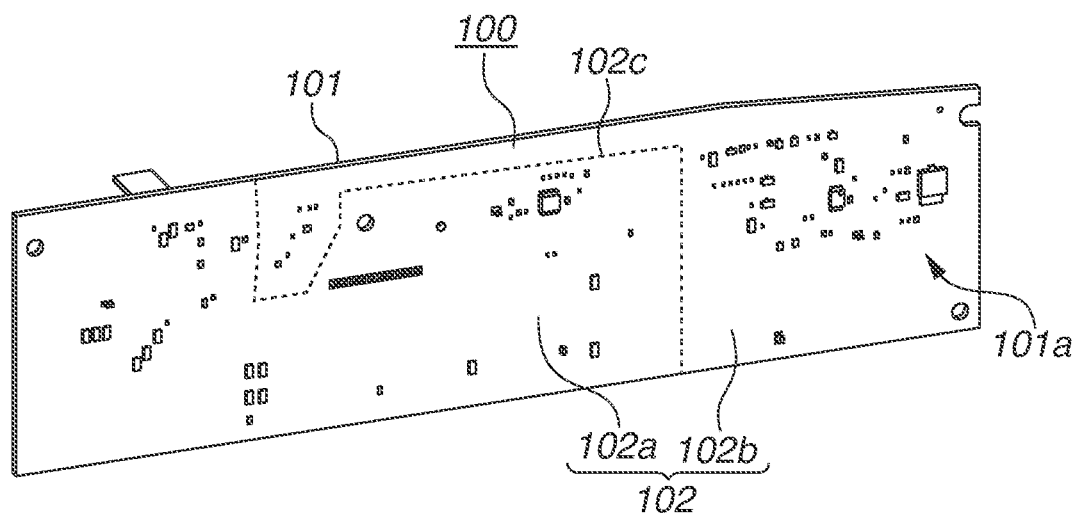

FIGS. 6A and 6B are perspective views illustrating the power source unit 100 according to the present exemplary embodiment. The power source unit 100 mainly includes a power supply board 101, circuits 102 (not illustrated) including printed copper foil wires and jumper wires, electronic components 103 connected to the circuits 102, and accessory components 104 attached to the electronic components 103.

There are various types of printed boards for the power supply board 101, including a single-sided board, a double-sided board, and a multilayer board. In the present exemplary embodiment, a single-sided board will be described below as an example. Various materials used for the power supply board 101 include paper phenol, paper epoxy, and glass. In the present exemplary embodiment, the power supply board 101 made of paper phenol will be described as an example. A single-sided board has a circuit surface 101a (printed surface) on which wiring patterns are printed with conductive materials, such as copper, and a mounting surface 101b opposite to the circuit surface 101a. Circuits (not illustrated) and the electronic components 103 formed on the circuit surface 101a are connected with conductive materials, such as solder and copper. A hole is formed in the power supply board 101, an electronic component 103 is disposed on the mounting surface 101b side, and the connecting terminal of the electronic component 103 is protruded to the circuit surface 101a side through the hole. Then, the circuit and the electronic component 103 are bonded with solder to achieve electrical and mechanical connections. In this process, the solder flow process is efficient in which the connection terminal of the electronic component 103 is protruded to the circuit surface 101a side through the hole of the power supply board 101, and, in this state, solder is blown up when the power supply board 101 is moved over a melted solder bath to solder the circuit and electronic component 103. Thus, relatively large-sized electronic components are often disposed on the mounting surface 101b side.

Various components are attached to the power supply board 101. For example, output connectors include a primary output connector 103b for outputting a primary current, and a secondary output connector 103h for outputting a secondary current.

The circuit has separate parts including a primary circuit 102a that mainly uses the primary current input from a commercial power source, and a secondary circuit 102b that converts the voltage of the primary current into a different voltage of the secondary current and uses the secondary current. The primary circuit 102a and the secondary circuit 102b are partitioned by a boundary line 102c.

The electronic components 103 include various elements. Examples of relatively large-sized electronic components 103 include an input connector 103a which is supplied with power from the outside via the power inlet 49, the output connector 103b for outputting power to the outside, and a transformer 103c for converting the voltage. Other examples of relatively large-sized electronic components 103 include a Schottky barrier diode 103d, an electrolytic capacitor 103e, a varistor 103f, and a fuse 103g. Small-sized electronic components 103 having large calorific values are further provided with a heat sink 104a for cooling serving as an accessory component. Since the heat sink 104a is made of a material having high heat conduction, such as aluminum and iron, the cooling effect increases with increasing superficial area. Thus, the material and shape of the heat sink 104a are often selected to realize a desired performance with a size equal to or less than the sizes of other large electronic components mounted on the mounting surface 101b. The power source unit 100 is often provided with the above-described plurality of large-sized electronic components in comparison with other circuit boards in the image forming apparatus 1. However, the aspect of the embodiments is not limited to these boards, electronic components, and accessories, and does not necessarily need to be provided with all of these elements.

Figure 7:
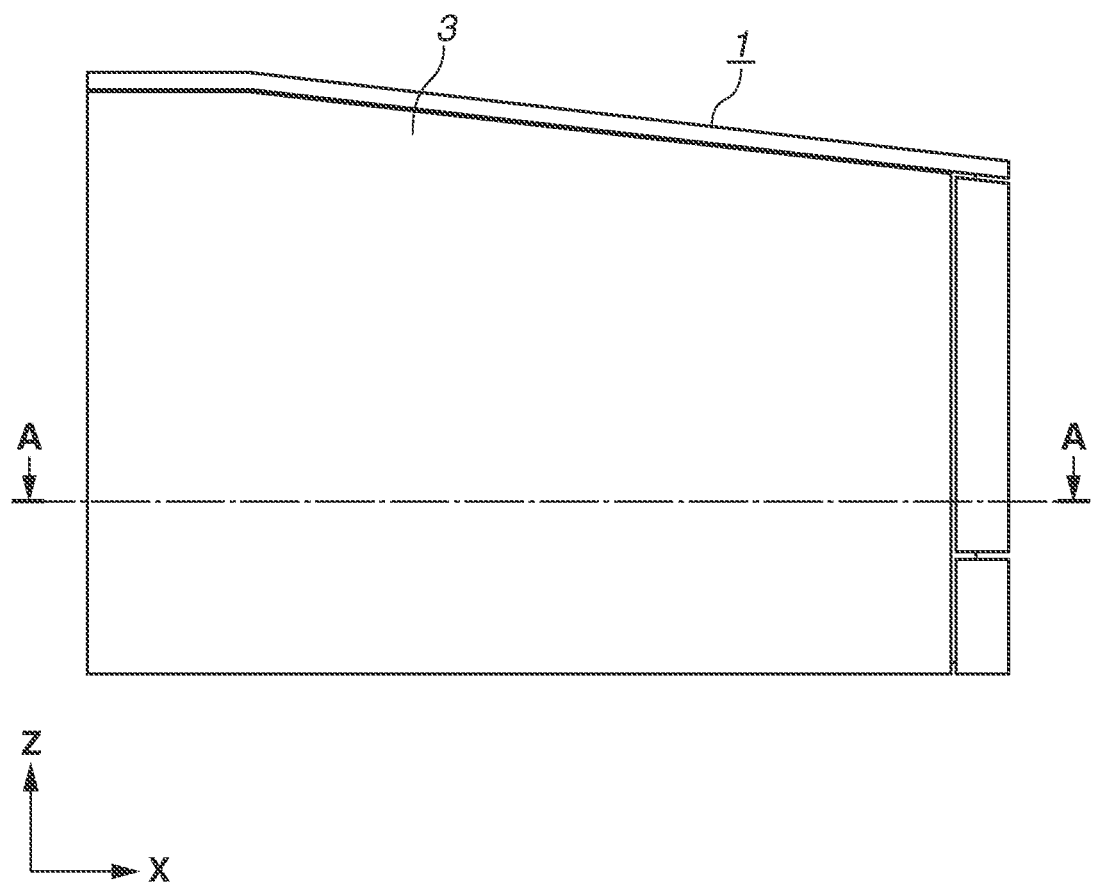
FIG. 7 illustrates the image forming apparatus according to the exemplary embodiment when viewed from the right side.
Figure 8A:
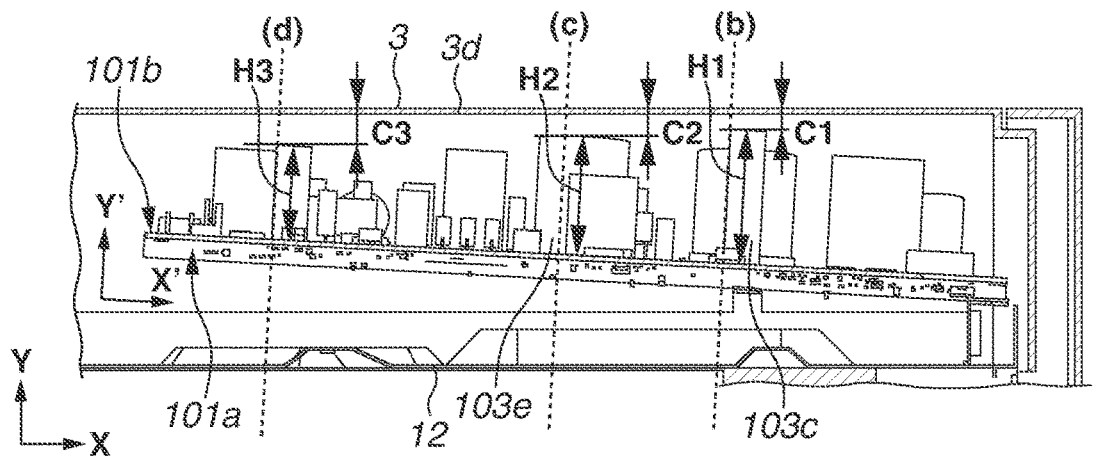
FIGS. 8A to 8D are sectional views each illustrating the vicinity of the power source unit according to the exemplary embodiment.
Figure 8B:
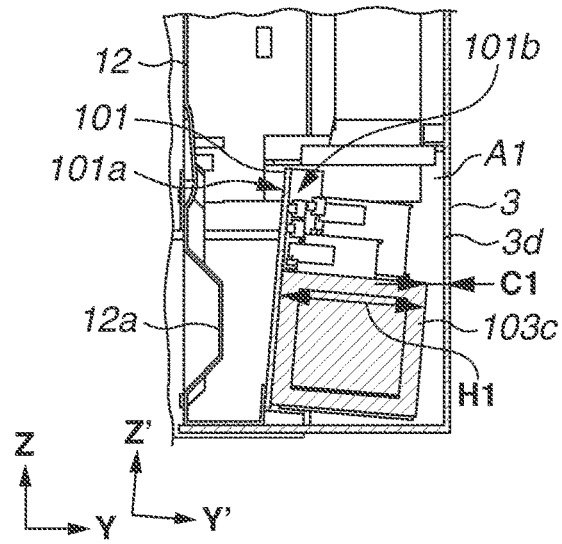
Figure 8C:
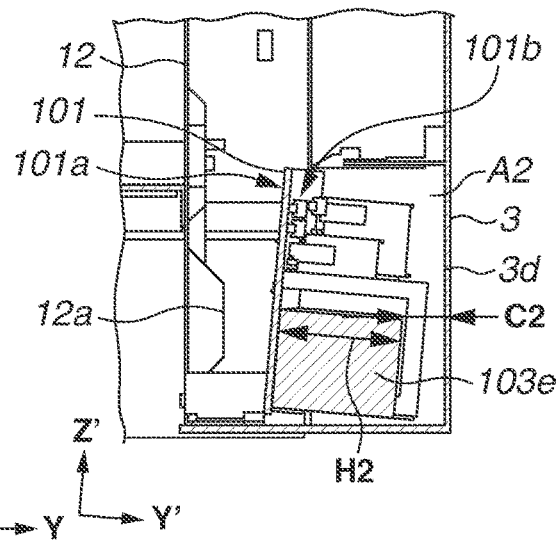

FIG. 7 illustrates the image forming apparatus 1 when viewed from the left side face. FIGS. 8A to 8D are sectional view illustrating the frame 10, the right cover 3, and the power source unit 100 according to the present exemplary embodiment. FIG. 8A is a sectional view taken along the line A-A in FIG. 7. FIG. 8B is a sectional view taken along the line (b) in FIG. 8A. FIG. 8C is a sectional view taken along the line (c) in FIG. 8A. As illustrated in FIGS. 8A to 8D, the right frame 12 and the right cover 3 are parallelly provided to extend in the directions of the coordinate axes X and Z. FIGS. 9A and 9B illustrate outer appearances of the power source unit 100.

(Inclination of Coordinate Axis X' with Respect to Coordinate Axis X)

As illustrated in FIG. 8A, when the power source unit 100 is viewed from the Z' direction to the −Z' direction, the coordinate axis X' is parallel to the plane of the power supply board 101 and orthogonally intersects with the coordinate axes Y' and Z. In other words, the coordinate axis X' is parallel to the mounting surface 101b, and the coordinate axis Y' is perpendicular to the mounting surface 101b.

Of the electronic components 103 of the power source unit 100, the transformer 103c (first electronic component) is the largest component, i.e., an electronic component 103 that is the tallest in the +Y' direction from the mounting surface 101b serving as the reference plane. A center line T1 of the transformer 103c extends in parallel with the coordinate axis Y' (FIG. 9A). With the center line T1 as a boundary line, the side including the larger region of the power supply board 101 is referred to as the a side, and the side including the smaller region of the power supply board 101 is referred to as the b side. A distance La from the board edge on the a side to the line T1 is made larger than a distance Lb from the board edge on the b side to the line T1.

The transformer 103c, which is the tallest electronic component 103, has a height (distance) H1 in the +Y' direction from the mounting surface 101b serving as the reference plane, as illustrated in FIGS. 8A to 8C, 9A, and 9B. The transformer 103c is disposed so that the shortest distance to the right cover 3 in the coordinate axis Y is a distance Meanwhile, the electrolytic capacitor 103e (second electronic component) has a height (distance) H2 in the +Y' direction from the mounting surface 101b serving as the reference plane. Referring to the cross-section illustrated in FIG. 9A, the electrolytic capacitor 103e is an electronic component 103 that is the second tallest next to the transformer 103c in the a side region to the left of the center line T1. The electrolytic capacitor 103e is disposed so that the shortest distance to the right cover 3 in the coordinate axis Y is a distance C2 (FIG. 8C).

According to the present exemplary embodiment, the power supply board 101 is disposed so that the coordinate axis X' parallel to the plane of the power supply board 101 intersects with the coordinate axis X, to become non-parallel to the right frame 12 and the right cover 3. More specifically, the power supply board 101 is disposed to be inclined with respect to the right frame 12 and the right cover 3 so that the difference between the heights H1 and H2 is larger than the difference between the distances C2 and (Inclination of Coordinate Axis Z' with Respect to Coordinate Axis Z)

Figure 8D:
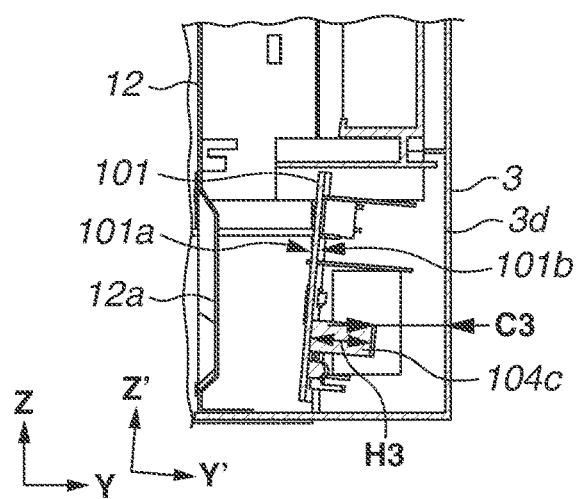
Figure 9A:
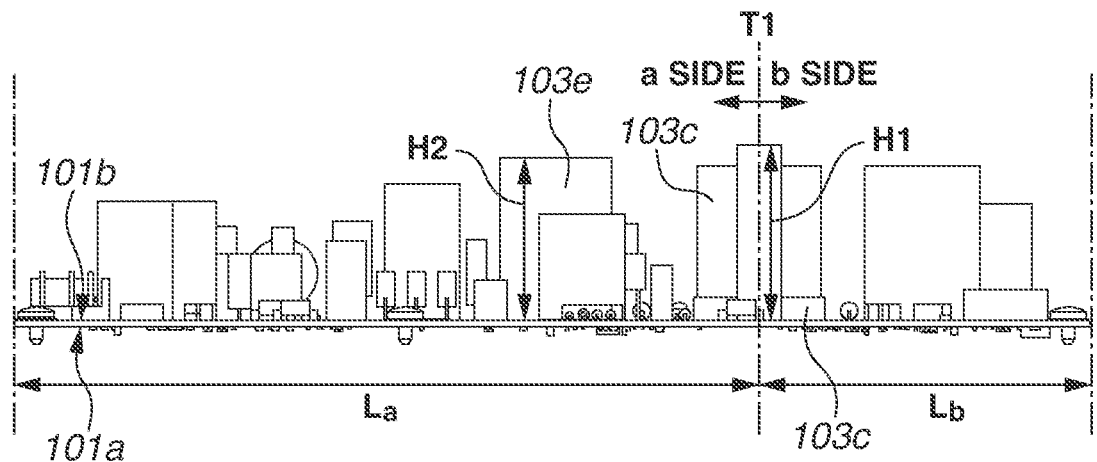
FIGS. 9A and 9B each illustrate the power source unit according to the exemplary embodiment.
Figure 9B:
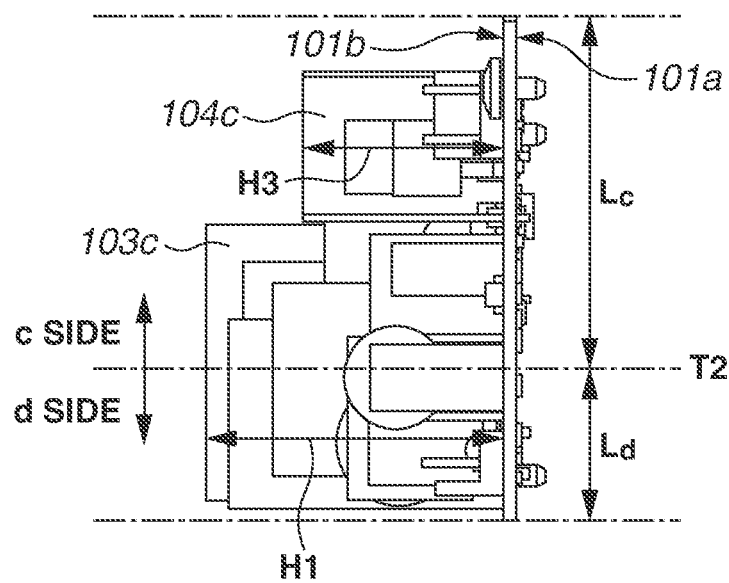

As illustrated in FIGS. 8B and 8D illustrating the power source unit 100 viewed from the X direction to the −X direction, the coordinate axis Z' is parallel to the plane of the power supply board 101 and orthogonally intersects with the coordinate axes Y' and Z'.

Of the electronic components 103 of the power source unit 100, the transformer 103c (first electronic component) is an electronic component 103 that is the tallest in the +Y' direction from the mounting surface 101b serving as the reference plane. A center line T2 of the transformer 103c extends in parallel with the coordinate axis Y' (FIG. 9B). With the center line T2 as a boundary line, the side including the larger region of the power supply board 101 is referred to as the c side, and the side including the smaller region of the power supply board 101 is referred to as the d side. A distance Lc from the board edge on the c side to the line T2 is made larger than a distance Ld from the board edge on the d side to the line T2.

The transformer 103c, which is the tallest electronic component 103, has a height (distance) H1 in the +Y' direction from the mounting surface 101b serving as the reference plane, as illustrated in FIG. 8B. The transformer 103c is disposed so that the shortest distance to the right cover 3 in the coordinate axis Y is a distance C1.

Meanwhile, a heat sink 104c (second electronic component) has a height (distance) H3 in the +Y' direction from the mounting surface 101b serving as the reference plane. Referring to the section illustrated in FIG. 9B, the heat sink 104c is an electronic component 103 that is the second tallest next to the transformer 103c in the c side region to the top of the center line T2. The heat sink 104c is disposed so that the shortest distance to the right cover 3 in the coordinate axis Y is a distance C3 (FIG. 8D).

According to the present exemplary embodiment, the power supply board 101 is disposed so that the coordinate axis Z' parallel to the plane of the power supply board 101 intersects with the coordinate axis Z, to become non-parallel to the right frame 12 and the right cover 3. More specifically, the power supply board 101 is disposed to be inclined with respect to the right frame 12 and the right cover 3 so that the difference between the heights H1 and H3 is made larger than the difference between the distances C3 and C1.

According to the present exemplary embodiment, the power supply board 101 is disposed to be three-dimensionally inclined with respect to the X and Z axes, as illustrated in FIGS. 8A to 8D.

(Grounding of Power Source Unit 100)

Figure 10A:
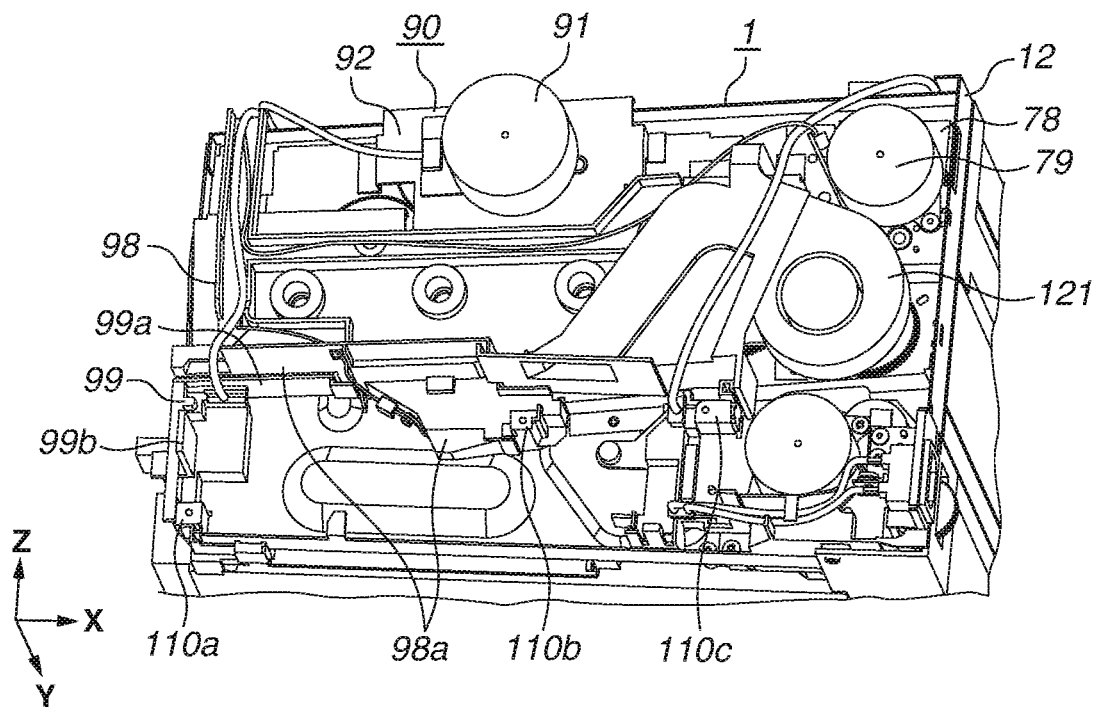
FIGS. 10A and 10B each illustrate an internal configuration of the image forming apparatus according to the exemplary embodiment.
Figure 10B:
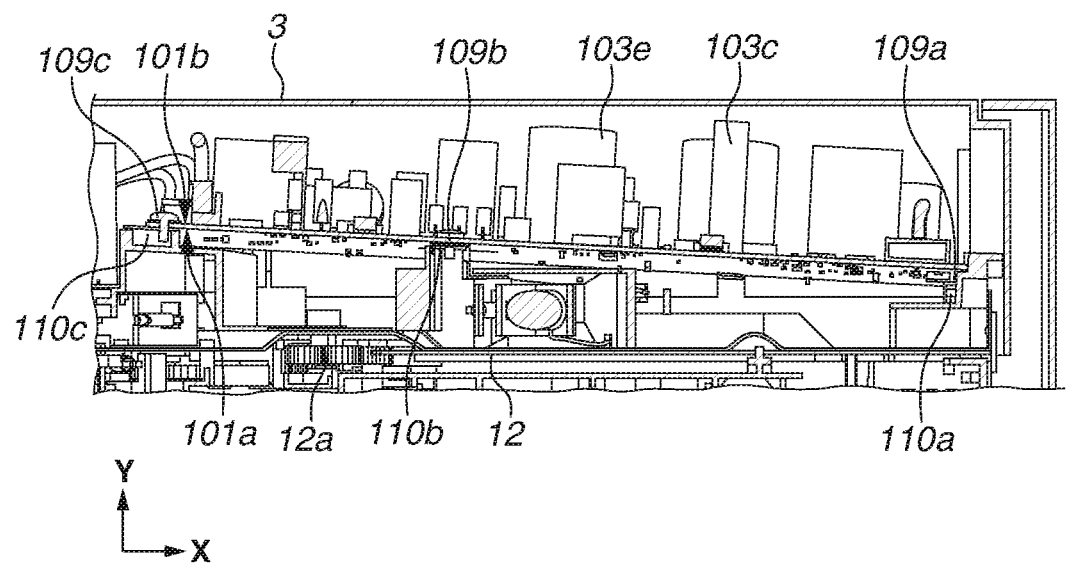

Grounding of the power source unit 100 will be described below. FIGS. 10A and 10B are perspective views illustrating the power source unit 100 and the image forming apparatus 1 excluding the outer surface cover. Grounding is applied for stable operations of the power source unit 100. The image forming apparatus 1 is externally grounded by the ground wire of a connected external power source via the cable plugged into the power inlet 49. However, a plurality of ground paths is provided in the image forming apparatus 1. Thus, according to the present exemplary embodiment, the power supply board 101 is provided with a plurality of the board-side ground connection members 105 serving as ground connection members on the board side, more specifically, three board-side ground connection members 105a, 105b, and 105c, as illustrated in FIG. 6A. By contrast, the main body of the image forming apparatus 1 is provided with three apparatus-side ground connection members 110a, 110b, and 110c serving as ground connection members on the apparatus side corresponding to the three board-side ground connection members 105a, 105b, and 105c, respectively, as illustrated in FIG. 6B. As described above, in a state where the power supply board 101 is attached to the image forming apparatus 1, the distances between the respective board-side ground connection members 105a, 105b, and 105c and the right frame 12 are different because the power supply board 101 is inclined with respect to the right frame 12. More specifically, the power supply board 101 is inclined so that the distance to the right frame 12 in the Y axis direction gradually decreases toward the +X direction (FIGS. 8A and 10B) and gradually decreases toward the −Z direction (FIGS. 8B to 8D). Thus, in a state where the power supply board 101 is attached to the image forming apparatus 1, the board-side ground connection member 105a is the closest to the right frame 12, and the board-side ground connection member 105c is the farthest from the right frame 12.

By contrast, the apparatus-side ground connection member 110a corresponds to the board-side ground connection member 105a where the power supply board 101 is closest to the right frame 12, and is formed of the right frame 12. The apparatus-side ground connection member 110b corresponds to the board-side ground connection member 105b, and is formed of a drive frame 92 of the drive unit 90. The apparatus-side ground connection member 110c corresponds to the board-side ground connection member 105c where the power supply board 101 is farthest from the right frame 12, and is formed of a motor sheet metal 48 that supports the supply drive motor 43 of the separation unit 40.

The frame 10, which forms a frame of the image forming apparatus 1 and has a conductivity, includes the left frame 11, the right frame 12, the main frame 13, the scanner frame 14, and the fixing frame 15. According to the present exemplary embodiment, the motor sheet metal 48 and the drive frame 92 are fastened and fixed to the right frame 12 with conductive screws (not illustrated). Thus, the motor sheet metal 48 and the drive frame 92 ensure continuity to the right frame 12 and also to the frame 10.

The power inlet 49 is supported by an integrated power source fixing sheet metal 49a that is fastened and fixed to the motor sheet metal 48 with a screw 49b. Thus, the power inlet 49 is fixed to the motor sheet metal 48 and also to the frame 10. Thus, the motor sheet metal 48, i.e., the frame 10 ensures continuity to the power source fixing sheet metal 49a via the conductive screw 49b. In addition, the power inlet 49 is configured so that the power source fixing sheet metal 49a is connected with the ground wire of an external power source connected through a cable plugged into the power inlet 49.

In this way, the board-side ground connection member 105a is connected to the ground wire of the external power source and grounded via the apparatus-side ground connection member 110a of the right frame 12 and the power source fixing sheet metal 49a. The board-side ground connection member 105b is connected to the ground wire of the external power source and grounded via the apparatus-side ground connection member 110b of the drive frame 92, the right frame 12, and the power source fixing sheet metal 49a. The board-side ground connection member 105c is connected to the ground wire of the external power source and grounded via the apparatus-side ground connection member 110c of the motor sheet metal 48 and the power source fixing sheet metal 49a. In other words, out of the ground connection members, the board-side ground connection member 105c connects to the inlet through a path having the least number of parts, and the board-side ground connection member 105b connects to the inlet through a path having the largest number of parts.

According to the present exemplary embodiment, by using a member for grounding the power supply board 101, the power supply board 101 is disposed to be inclined with respect to the right frame 12, and fixed to the frame 10 so that the distance between the power supply board 101 and the right frame 12 varies depending on the position. This configuration makes it possible to use the parts for grounding the power supply board 101 also as members for supporting the power source unit 100, thus eliminating the need of additional parts and reducing the number of parts.

Although, in the present exemplary embodiment, a plurality of members is fixed with screws to ensure continuity, the disclosure is not limited thereto. For example, nonconductive screws are also applicable as long as continuity is ensured through direct contact of a conductive member. In addition, members may be fixed by using means other than screws.

(Drive Unit 90)

Figure 11A:
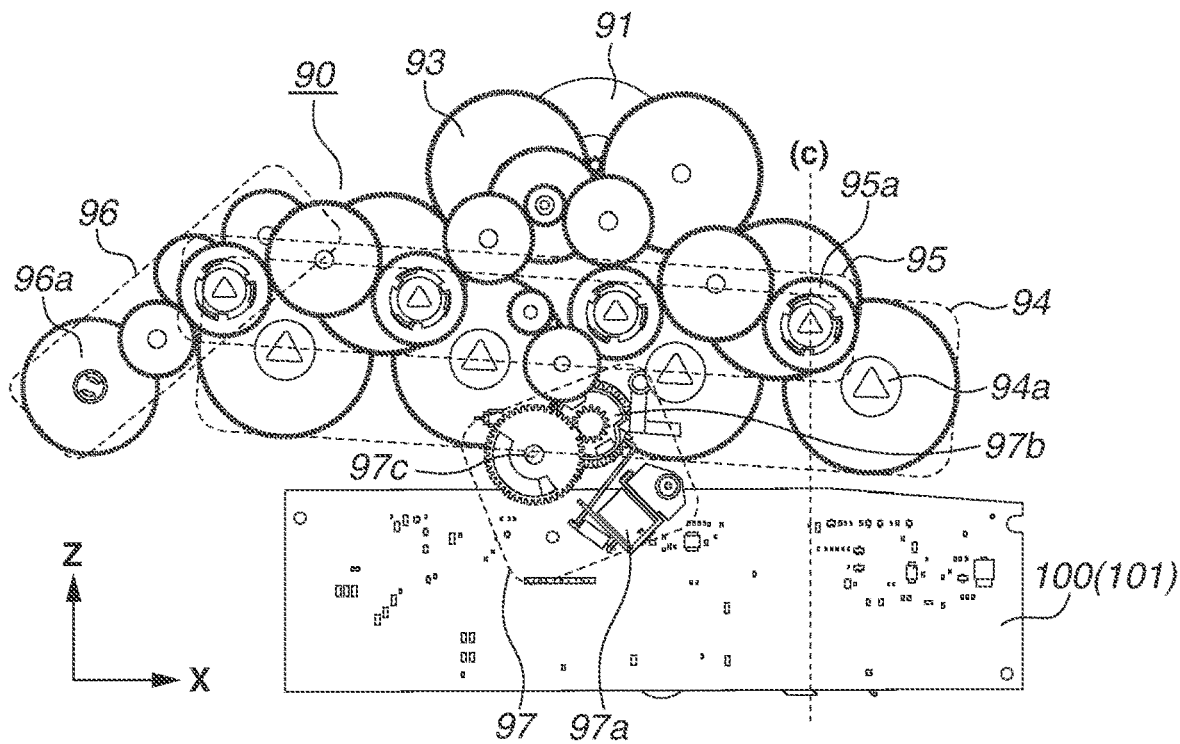
FIGS. 11A to 11C each illustrate an internal configuration of the image forming apparatus according to the exemplary embodiment.
Figure 11B:
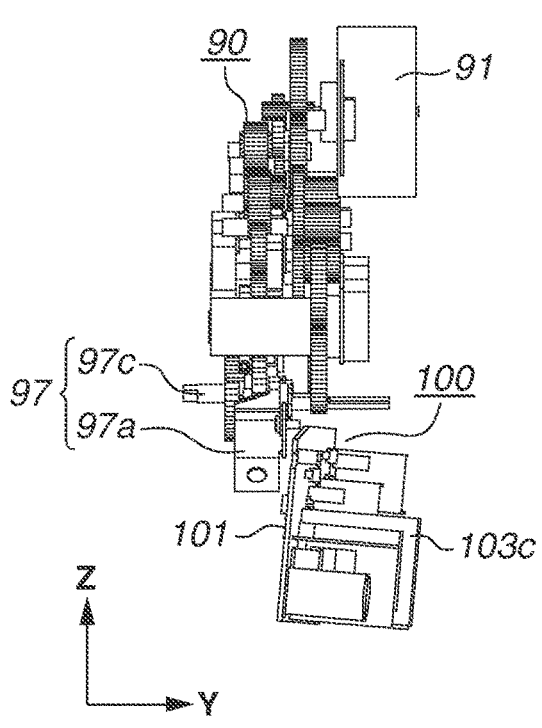
Figure 11C:
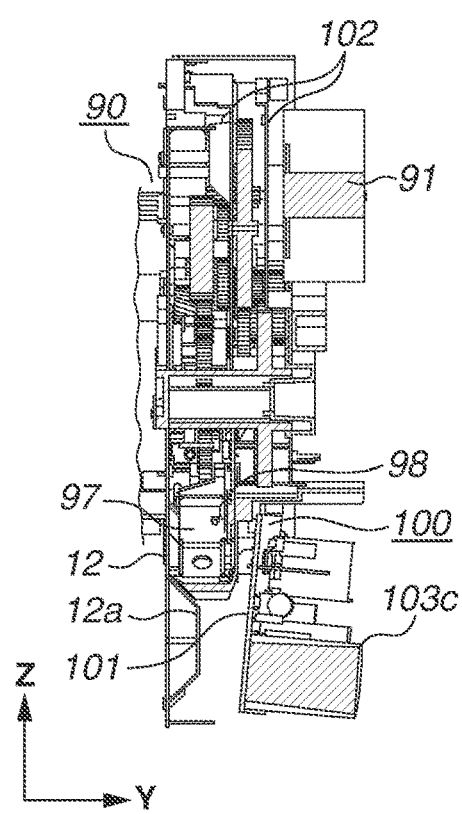

FIGS. 11A to 11C schematically illustrate configurations of the drive unit 90. FIG. 11A illustrates the drive unit 90 and the power source unit 100 viewed from the −Y direction to the +Y direction. FIG. 11B illustrates the drive unit 90 and the power source unit 100 viewed from the −X direction to the +X direction. FIG. 11C is a sectional view taken along the cross-section (c) in FIG. 11A.

The drive unit 90 is disposed so that a part of the drive unit 90 is disposed between the right frame 12 and the power source unit 100. The drive unit 90 mainly includes the drive frame 92, the drive motor 91, and a drive transfer mechanism 93.

The drive frame 92 is fixed to the right frame 12 to support each component of the drive unit 90. The drive frame 92 is provided with a wire bundle guide 98 that supports wire bundles (FIGS. 2A and 2B). The wire bundles include wire bundles 109a, 109b, 109c, and 109d. The wire bundle 109a connects the drive motor 91 and a control board (not illustrated), and the wire bundle 109b connects the fixing drive motor 79 and the control board. The wire bundle 109c connects the power source unit 100 and the power supply board 101, and the wire bundle 109d connects a separation solenoid 97a of the drive unit 90 and the control board. The wire bundle guide 98 serves also as a part of a shielding wall 98a that is a partition between the drive transfer mechanism 93 and the power source unit 100 (FIG. 11C). A blindfold guide 99 is provided in the vicinity of the wire bundle guide 98. The blindfold guide 99 includes a shielding wall 99a and a blindfold wall 99b (described below). Together with the shielding wall 98a, the shielding wall 99a serves as a partition between the drive transfer mechanism 93 and the power source unit 100.

The drive transfer mechanism 93 mainly includes a drum drive unit 94, a toner supply drive unit 95, a primary transfer drive unit 96, and a separation drive unit 97 and transmits the driving force from the drive motor 91 to each component. The drum drive unit 94 includes a drum drive gear 94a and is engaged with the photosensitive drum 24 to rotatably drive the photosensitive drum 24. The toner supply drive unit 95 includes a toner supply drive gear 95a and is configured to transmit the driving force from the drive motor 91 to the toner supply unit 23 for rotation, thus supplying toner to the photosensitive drum 24. The primary transfer drive unit 96 includes a primary transfer drive gear 96a and is configured to transmit the driving force from the primary transfer drive gear 96a to the drive roller 32 (FIG. 5C). The separation drive unit 97 makes the primary transfer roller 34 (FIG. 5C) movable. More specifically, the separation drive unit 97 can change the position of the primary transfer roller 34 between a pressing position and a separated position. The pressing position is the position at which the primary transfer roller 34 urges the intermediate transfer belt 31 to enable transferring a toner image from the photosensitive drum 24 to the intermediate transfer belt 31. The separated position is the position where the primary transfer roller 34 is retracted from the pressing position and the intermediate transfer belt 31 is separated from the photosensitive drum 24.

More specifically, a clutch with an electromagnetic actuator is used as the separation drive unit 97. The separation drive unit 97 includes the separation solenoid 97a serving as an electromagnetic actuator, a separation partially-toothless gear 97b of which the rotation is restricted/permitted by the separation solenoid 97a, and a separation cam 97c driven by the separation partially-toothless gear 97b. The separation cam 97c is made movable to slide a support member (not illustrated) that supports the primary transfer roller 34. More specifically, the separation cam 97c is configured to, when the separation solenoid 97a is turned ON, permit the rotation of the separation partially-toothless gear 97b and transmit the driving force to the separation cam 97c to turn the separation cam 97c, thus changing the position of the primary transfer roller 34.

The arrangement of each component of the drive unit 90 will be described below. The drum drive unit 94 and the toner supply drive unit 95 are disposed to face the four different cartridges 21 across the right frame 12. The separation cam 97c is disposed to face the intermediate transfer belt 31 across the right frame 12. The primary transfer drive unit 96 is disposed to face the drive roller 32 across the right frame 12. As illustrated in FIG. 10A, in the drive unit 90, the drum drive unit 94 and the toner supply drive unit 95 are disposed at the vertical center, the separation drive unit 97 is disposed at a lower portion, and the drive motor 91 is disposed at an upper portion. The separation drive unit 97 including the separation cam 97c and the separation solenoid 97a is provided between the power supply board 101 and the right frame 12, and is disposed to face the circuit surface 101a via the shielding wall 98a (FIG. 11C).

According to the present exemplary embodiment, the drive transfer mechanism 93 of the drive unit 90, more specifically, the separation solenoid 97a of the separation drive unit 97 is disposed in the space between the right frame 12 and the power supply board 101. The space is obtained by the power supply board 101 being disposed to be inclined with respect to the right frame 12. More specifically, the separation solenoid 97a is disposed outside the frame 10 (right frame 12). This arrangement can reduce the width of the image forming apparatus 1 in the Y direction in comparison with a case where the power supply board 101 is disposed in parallel with the right frame 12 and a case where the separation solenoid 97a is disposed inside the frame 10 (right frame 12). This arrangement also can reduce the height of the image forming apparatus 1 in the X direction in comparison with a case where the power supply board 101 and the separation solenoid 97a are disposed to be shifted in the X direction. This arrangement further enables prevention of the increase of the image forming apparatus 1 in size.

(Supply Drive Motor 43 and Supply Drive Mechanism 44)

Figure 12A:
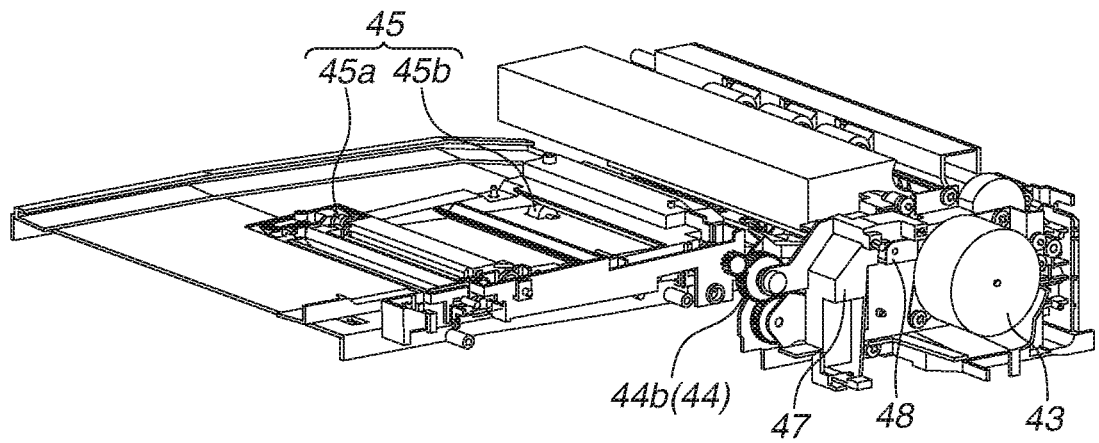
FIGS. 12A and 12B each illustrate an internal configuration of the image forming apparatus according to the exemplary embodiment.
Figure 12B:
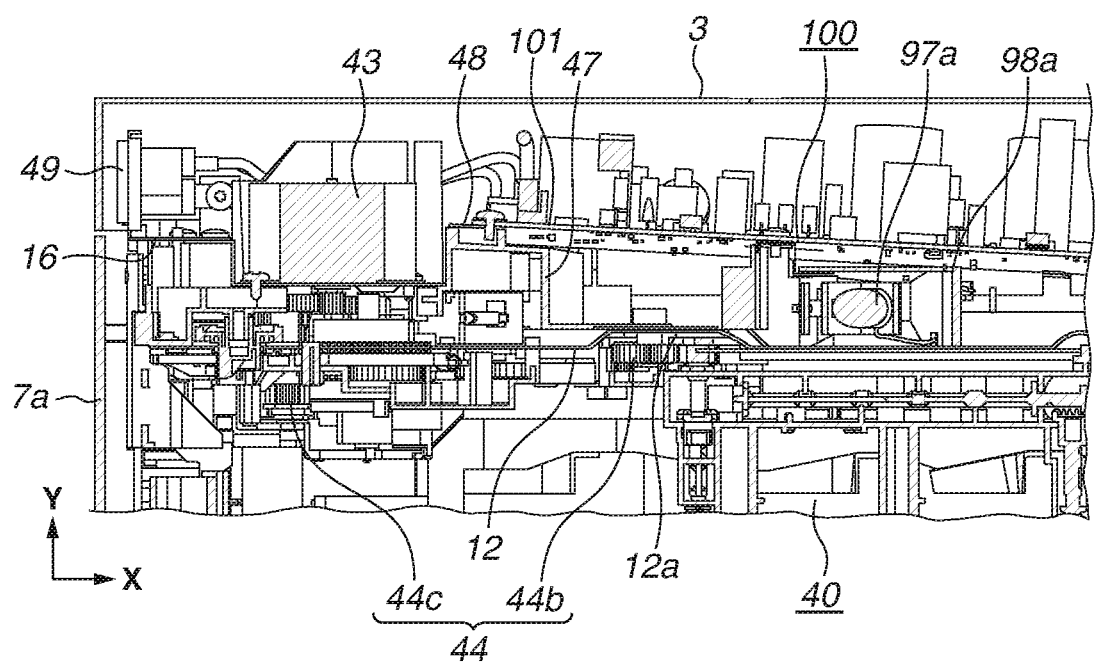

According to the present exemplary embodiment, parts of the supply drive motor 43 and the supply drive mechanism 44, which are drive units, are disposed between the right frame 12 and the power source unit 100. FIG. 12A is a perspective view illustrating a configuration in the vicinity of the supply drive motor 43 and the supply drive mechanism 44. FIG. 12B is a sectional view illustrating the image forming apparatus 1 taken along the plane X-Y. The supply drive motor 43 transmits the driving force to the feed roller 41, the separation roller pair 42, the manual feed conveyance unit 45, and the conveyance unit 50 via the supply drive mechanism 44 to drive these units. The supply drive mechanism 44 includes a supply drive gear train 44a (not illustrated) for operating the feed roller 41 and the separation roller pair 42, a pre-conveyance drive gear train 44b for operating the manual feed conveyance unit 45, and a post-conveyance drive gear train 44c for operating the conveyance unit 50. The large-sized supply drive motor 43 is disposed on the rear side of the power source unit 100 and outside the right frame 12 to facilitate the connection of electrical wire bundles. On the other hand, the feed roller 41, the separation roller pair 42, the manual feed conveyance unit 45, and the conveyance unit 50 are disposed inside the right frame 12, which is a paper conveyance space, to convey paper. Thus, the driving force of the supply drive motor 43 disposed outside the frame 10 is transmitted to the feed roller 41, the separation roller pair 42, the manual feed conveyance unit 45, and the conveyance unit 50 disposed inside the frame 10, via the supply drive mechanism 44.

According to the present exemplary embodiment, a part of the supply drive gear train 44a of the supply drive mechanism 44 covered by a supply cover 47 (shielding member) is disposed between the right frame 12 and the power supply board 101. By overlapping a part of the supply drive gear train 44a of the supply drive mechanism 44 with the power supply board 101 in the Y direction in this way, the width in the X direction can be reduced in comparison with a case where the supply drive gear train 44a of the supply drive mechanism 44 and the power supply board 101 are disposed being shifted in the X direction. This arrangement further enables the prevention of the increase of the image forming apparatus 1 in size.

The manual feed conveyance unit 45 of the supply drive mechanism 44 is disposed in a projection 12a (FIG. 3) of the outwardly protruded right frame 12, and is provided to face the power source unit 100 with the right frame 12 therebetween. The projection 12a of the right frame 12 is provided to protrude into the space between the right frame 12 and the power supply board 101, and a part of the manual feed conveyance unit 45 is disposed inside the projection 12a. The space is obtained by the power supply board 101 being disposed to be inclined with respect to the right frame 12. This arrangement enables reduction in the width of the image forming apparatus 1 in the Y-direction in comparison with a case where the projection 12a is not provided on the right frame 12. This arrangement further enables prevention of the increase of the image forming apparatus 1 in size.

As described above, the size of the image forming apparatus 1 can be reduced by other units being disposed in the space between the right frame 12 and the power supply board 101. The space is obtained by disposing the power supply board 101 to be inclined with respect to the right frame 12.

(Air Duct)

A configuration of an air duct according to the present exemplary embodiment will be described below with reference to FIGS. 13A to 14C. Some electronic components on the power supply board 101 emit heat during operation. Further, each electronic component has an upper-limit for the temperature at which the component can normally operate. If there is an electronic component that may reach a high temperature, control is to be performed to maintain the temperature at the upper-limit or below. If there are many spaces around the power supply board 101, a cooling effect produced by the natural convection can be expected. However, the downsizing of the image forming apparatus 1 has recently been demanded. Since other units are closely and densely disposed around the power supply board 101, it is hard to provide many spaces around the around power supply board 101, making it hard to expect a cooling effect produced by the natural convection.

Thus, in the present exemplary embodiment, to control the temperature of the electronic components 103 at a predetermined temperature or below, a fan is provided to introduce ambient air into the image forming apparatus 1, and then the introduced ambient air is blown to the electronic components 103 of the power source unit 100 to cool the electronic components 103.

Figure 13A:
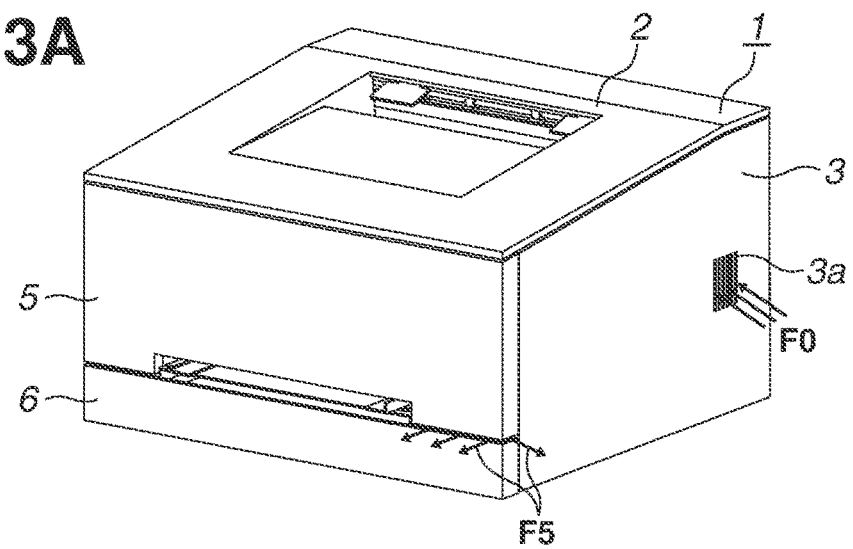
FIGS. 13A to 13C each illustrate an air duct of the image forming apparatus according to the exemplary embodiment.
Figure 13B:
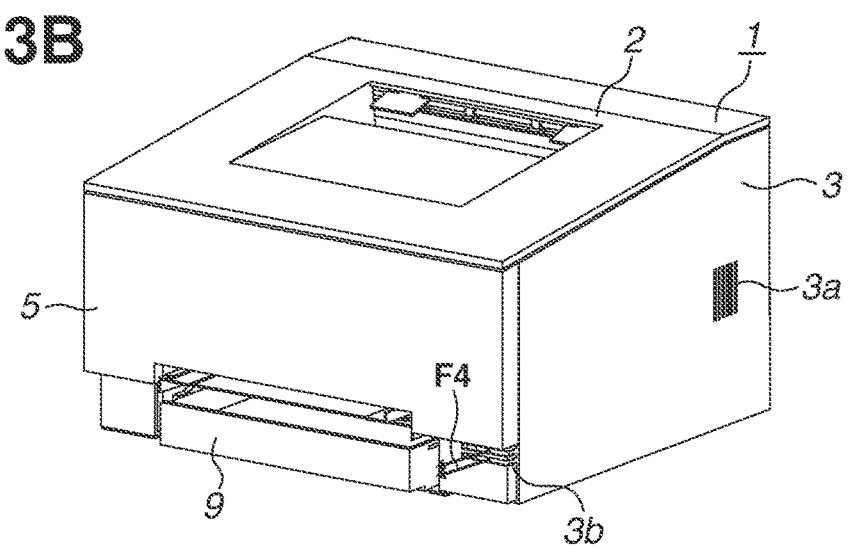
Figure 13C:
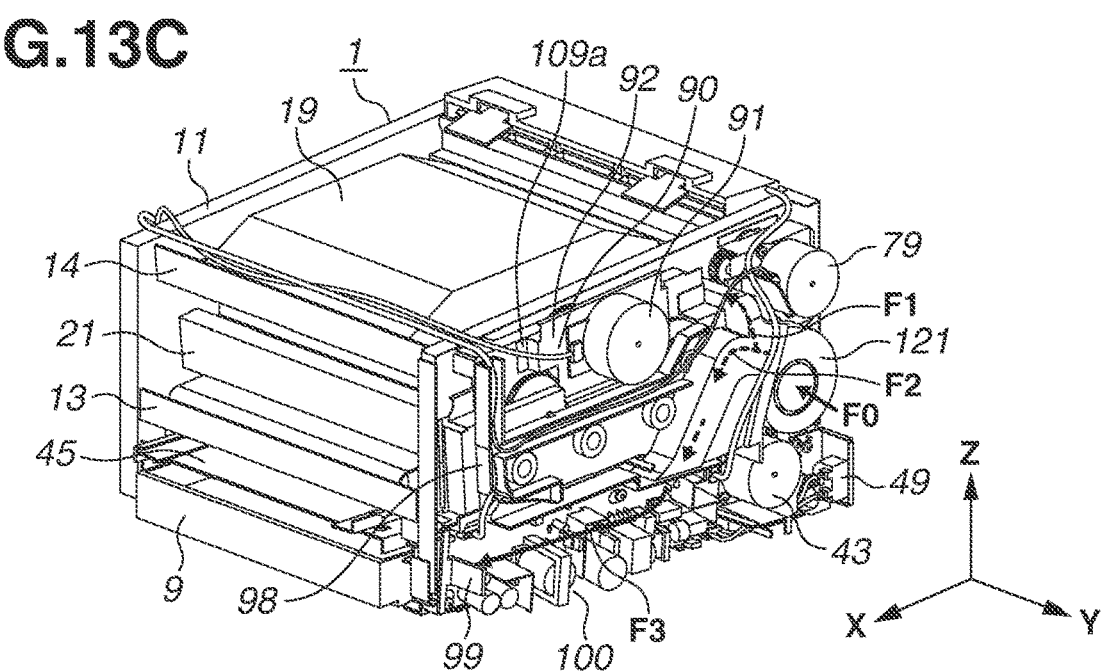

FIGS. 13A to 13C and FIGS. 14A to 14C illustrate air currents in the image forming apparatus 1. FIG. 13A illustrates air suction from and exhaust to the outside of the image forming apparatus 1. An air current F0 is produced by air suction from the outside of the image forming apparatus 1, and an air current F5 is an exhaust air current to the outside of the image forming apparatus 1. The air current F0 is produced by air suction through a suction port 3a with a louver disposed on the right cover 3. The air current F5 is produced when air is discharged through the interstice between the front door 5 and the cassette cover 6 that covers the front face of the cassette 9. FIG. 13B illustrates the image forming apparatus 1 with the cassette cover 6 removed. An air current F4 is produced when air is discharged through an exhaust port 3b with a louver disposed on the right cover 3. The air current F4 passes through the gap between the front door 5 and the cassette cover 6 that covers the front face of the cassette 9 to become the air current F5. FIG. 13C is a perspective view illustrating air currents in the image forming apparatus 1. FIG. 13C illustrates the image forming apparatus 1 with the outer surface covers including the top cover 2, the right cover 3, the left cover 4, the front door 5, and the cassette cover 6 removed.

Figure 14A:
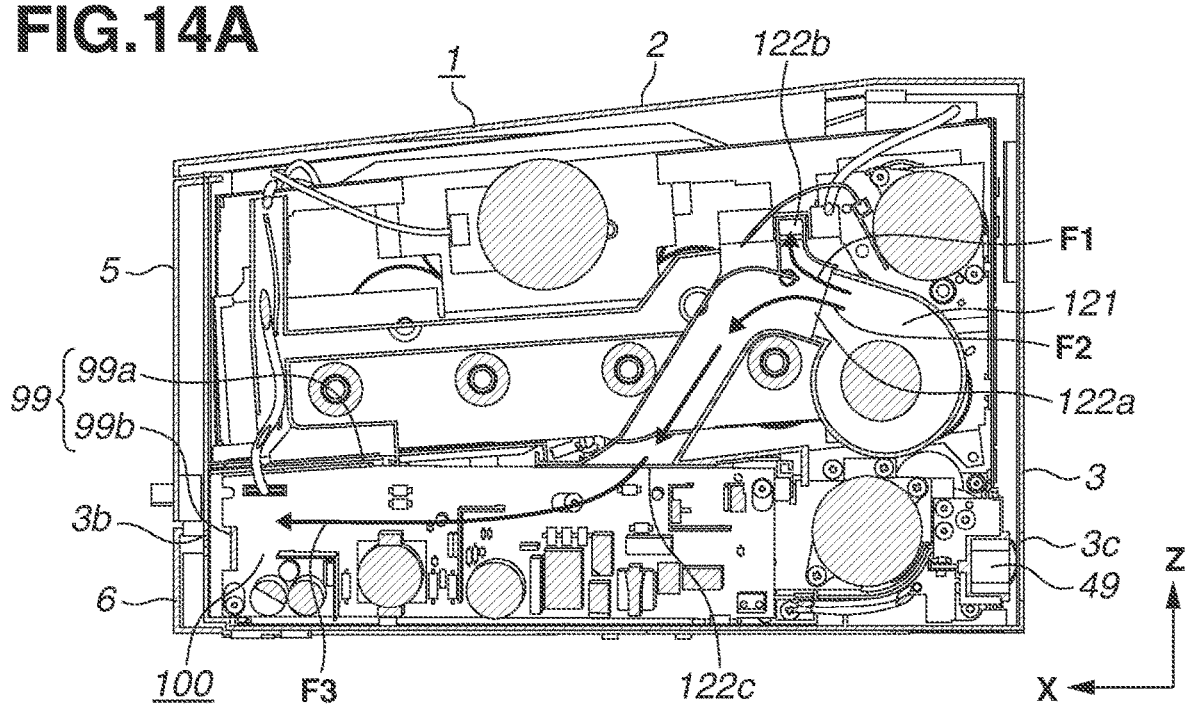
FIGS. 14A to 14C each illustrate an internal configuration of the image forming apparatus according to the exemplary embodiment.
Figure 14B:
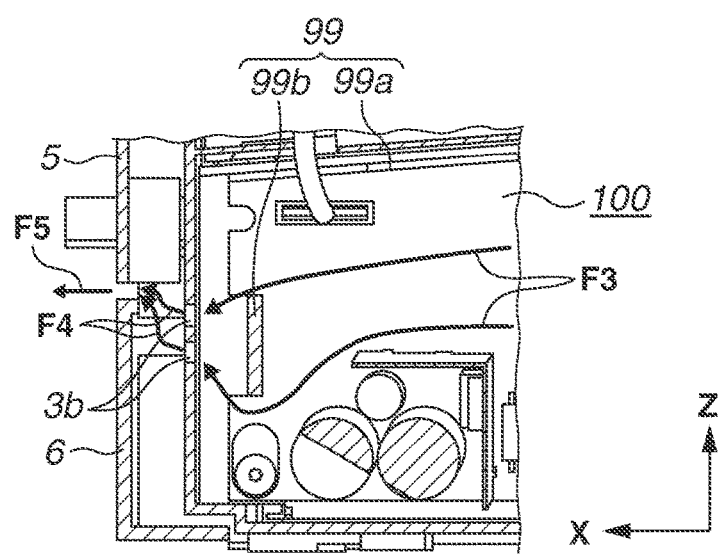
Figure 14C:
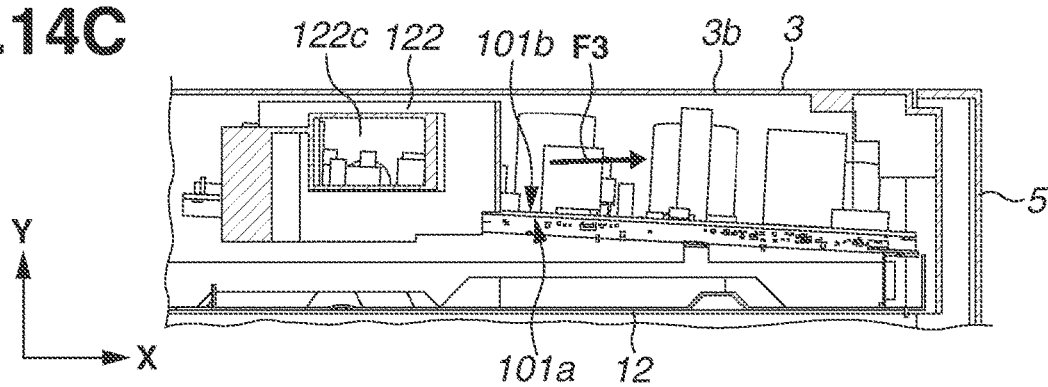

FIG. 14A is a sectional view illustrating air currents in the image forming apparatus 1. A fan 121 turns blades (not illustrated) to generate an air current, and sucks air from the suction port 3a having a louver. The air sucked by the fan 121 is supplied so as to branch into air currents F1 and F2 by an air duct formed by a duct 122. The air current F1 passes through the inside of the duct 122 and flows in the region where the cartridge 21 is provided, from an opening 122b of the duct 122 to cool the cartridge 21. The air current F2 flows from an opening 122c of the duct 122 to the region where the power source unit 100 (power supply board 101) is provided. In this region, the air current F2 becomes the air current F3 that cools the power source unit 100 (FIG. 14C). The air that passed through the power source unit 100 flows as the downstream air current F4 and then is discharged to the outside of the image forming apparatus 1 as the air current F5. FIG. 14B is a sectional view illustrating the vicinity of the exhaust port 3b. To prevent the power source unit 100 from being visually recognized directly from the outside of the image forming apparatus 1 through the exhaust port 3b, the blindfold wall 99b of the blindfold guide 99 is provided in the vicinity of the exhaust port 3b on the right cover 3. Thus, in the vicinity of the exhaust port 3b, the air current F3 passes through the paths above and below the blindfold wall 99b in a branched way, and then is discharged through the exhaust port 3b.

A cooling configuration of the power source unit 100 with the air current F3 according to the present exemplary embodiment will be described below. The power source unit 100 is surrounded by the shielding wall 98a that partitions the power source unit 100 and the drive unit 90 to separate the space, and the right cover 3 and the right frame 12 (frame 10) which form the outer surface, and is configured to be cooled by the air current F3 passing through this surrounded space.

In other words, the fan 121 generates the air current F3 that flows from one side to the other side of the power supply board 101. The air current F3 flowing in the space between the mounting surface 101b of the power supply board 101 and the right cover 3 contacts the electronic components 103 to a further extent to more efficiently cool the electronic components 103 than the air current F3 flowing in the space between the circuit surface 101a and the frame 10. Thus, in one embodiment, the air current F3 flows in the flow path cross-section between the mounting surface 101b and the right cover 3, more specifically, the cross-section between the upper hem extending in the Y direction from the Z-direction upper edge of the mounting surface 101b to the right cover 3 and the lower hem extending in the Y direction from the Z-direction lower edge of the mounting surface 101b to the right cover 3.

However, if the electronic components 103 occupy the flow path cross-section, the cross-sectional area allowing an air current decreases, resulting in decrease in the amount of air current. In particular, if a large-sized electronic component 103 is disposed on the upstream side of the air current F3 and a small-sized electronic component 103 on the downstream side thereof, the cooling efficiency of the electronic components 103 decreases.

More specifically, on the upstream side where a large-sized electronic component 103 is disposed, the electronic component 103 occupies a large part of the flow path cross-section, and hence the sectional area allowing an air current decreases, resulting in decrease in the amount of air current. On the other hand, on the downstream side where a small-sized electronic component 103 is disposed, the electronic component 103 occupy a small part of the flow path cross-section, and hence the cross-sectional area allowing an air current increases. However, the amount of air current is decreased on the upstream side where a large-sized electronic component 103 is disposed. Thus, on the downstream side where a small-sized electronic component 103 is disposed, the flow rate of the air current F3 decreases, resulting in decrease in the cooling efficiency of the electronic components 103.

Thus, in the present exemplary embodiment, the cross-section parallel to the plane Y-Z defined by the mounting surface 101b of the power supply board 101 and the right cover 3 facing the mounting surface 101b is differentiated between the upstream and downstream sides of the air current F3, i.e., the cross-section on the downstream side is made larger than the cross-section on the upstream side. In other words, the power supply board 101 is inclined with respect to the right cover 3, so that this cross-section gradually increases toward the +X direction side from the −X direction side. The projection 12a of the right frame 12 and the separation solenoid 97a of the separation drive unit 97 are provided in the space between the circuit surface 101a and the frame 10 to downsize the apparatus. This space is produced by disposing the power supply board 101 to be inclined with respect to the right cover 3.

Further, of the electronic components 103 disposed on the mounting surface 101b of the power supply board 101, a large-sized (tall) component is disposed on the downstream side of the air current F3 and a small-sized (short) component on the upstream side thereof. More specifically, the electronic components 103 are disposed on the mounting surface 101b so that the heights (length in the Y direction) of the electronic components 103 gradually increases toward the +X direction from the −X direction.

More specifically, referring to the cross-sectional view in FIG. 8B taken along the cross-section B-B in FIG. 8A on the downstream side of the air current F3, there is disposed the transformer 103c that is the tallest electronic component 103 in the +Y' direction from the mounting surface 101b serving as the reference plane. On the other hand, referring to the cross-sectional view in FIG. 8C taken along the cross-section C-C in FIG. 8A on the upstream side of the air current F3, there is disposed the electrolytic capacitor 103e that is the second tallest electronic component 103 next to the transformer 103c in the +Y' direction from the mounting surface 101b serving as the reference plane.

Referring to FIG. 8B, the flow path cross-section A1 refers to the cross-section between the mounting surface 101b and the right cover 3, more specifically, the cross-section between the upper hem extending in the Y direction from the Z-direction upper edge of the mounting surface 101b to the right cover 3 and the lower hem extending in the Y direction from the Z-direction lower edge of the mounting surface 101b to the right cover 3. Likewise, referring to FIG. 8C, the flow path cross-section A2 refers to the cross-section between the mounting surface 101b and the right cover 3, more specifically, the cross-section between the upper hem extending in the Y direction from the Z-direction upper edge of the mounting surface 101b to the right cover 3 and the lower hem extending in the Y direction from the Z-direction lower edge of the mounting surface 101b to the right cover 3. The flow path cross-section A1 on the downstream side of the air current F3 is made larger than the flow path cross-section A2 on the upstream side of the air current F3.

The flow path cross-section A1 on the downstream side of the air current F3 is occupied by the transformer 103c that is the tallest electronic component 103, so that the cross-sectional area allowing an air current decreases, resulting in decrease in the amount of air current. Likewise, the flow path cross-section A2 on the upstream side of the air current F3 is occupied by the electrolytic capacitor 103e, so that the cross-sectional area allowing an air current decreases, resulting in decrease in the amount of air current. However, the reduced amount of air current for the flow path cross-section A2 can be made smaller than that for the flow path cross-section A1.

Thus, the power supply board 101 is inclined with respect to the right cover 3, and the flow path cross-section gradually increases toward the downstream side from the upstream side of the air current F3 (A1>A2). In this configuration, the cross-sectional area of the flow path cross-section A1 on the upstream side of the air current F3 is increased. Thus, even if a large-sized electronic component 103, such as the transformer 103c, is disposed, air can be smoothly guided, thus preventing the reduction of the amount of air current. On the other hand, the cross-sectional area of the flow path cross-section A2 on the upstream side of the air current F3 is decreased. Thus, the air current F3 can uniformly flow, making it possible to cool the electrolytic capacitor 103e to a sufficient extent.

Since the image forming apparatus 1 includes a heat-generating unit in addition to the power source unit 100, the temperature in the apparatus often becomes higher than the ambient air. Although it is desirable to directly introduce the ambient air for air supply to the power source unit 100, the disclosure is not limited thereto. For example, if a heating component is disposed on the path for introducing the ambient air to the power source unit 100 via a fan, there is no harm because the cooling effect can be produced as long as the air temperature is lower than the electronic components 103.

As discussed above, the aspect of the embodiments provides a small-sized image forming apparatus that has a devised power source layout and provides a favorable power source cooling efficiency.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-118718, filed Jul. 9, 2020, which is hereby incorporated by reference herein in its entirety.

What is claimed is:

1. An image forming apparatus comprising:
   an image forming unit configured to form an image on a recording material;
   a first frame and a second frame disposed to sandwich the image forming unit therebetween;
   an outer surface member configured to cover the first frame; and
   a circuit board disposed at an outer side of the first frame opposite to an inner side of the first frame at which the image forming unit is disposed, and disposed between the first frame and the outer surface member,
   wherein the circuit board includes a printed board, a first electronic component disposed on a mounting surface of the printed board, and a second electronic component that is smaller than the first electronic component in a direction perpendicular to the mounting surface and disposed on the mounting surface of the printed board,
   wherein the circuit board is disposed so that the mounting surface faces the outer surface member and the mounting surface is inclined with respect to the first frame, and
   wherein the first electronic component and the second electronic component are arranged in a predetermined direction, a first distance between a first end of the printed board in the predetermined direction and the outer surface member is longer than a second distance between a second end of the printed board in the predetermined direction and the outer surface member, the first end is closer to the first electronic component than the second electronic component in the predetermined direction, and the second end is closer to the second electronic component than the first electronic component in the predetermined direction.

2. The image forming apparatus according to claim 1, wherein the first electronic component is an electronic component having a largest height from the mounting surface in the direction perpendicular to the mounting surface, and
   wherein the second electronic component is an electronic component having a second largest height from the mounting surface in the direction perpendicular to the mounting surface.

3. The image forming apparatus according to claim 2, wherein another unit is disposed between the circuit board and the first frame.

4. The image forming apparatus according to claim 3, wherein the other unit includes a drive unit for transmitting a driving force to the forming unit.

5. The image forming apparatus according to claim 2, wherein the first frame has a projection protruding toward the circuit board at a position at which the circuit board faces the first frame.

6. The image forming apparatus according to claim 2, wherein the circuit board includes a low-voltage power supply board.

7. The image forming apparatus according to claim 2, further comprising a fan configured to generate an air current flowing from one side to another side of the circuit board, wherein a gap between the circuit board and the printed board gradually increases toward a downstream side from an upstream side of the air current.

8. The image forming apparatus according to claim 1, wherein a difference between a height of the first electronic component from the mounting surface in the direction and a height of the second electronic component from the mounting surface in the direction is larger than a difference between the first gap between the first electronic component and the outer surface member and a second gap between the second electronic component and the outer surface member.

9. The image forming apparatus according to claim 8, wherein another unit is disposed between the circuit board and the first frame.

10. The image forming apparatus according to claim 9, wherein the other unit includes a drive unit for transmitting a driving force to the forming unit.

11. The image forming apparatus according to claim 8, wherein the first frame has a projection protruding toward the circuit board at a position at which the circuit board faces the first frame.

12. The image forming apparatus according to claim 8, wherein the circuit board includes a low-voltage power supply board.

13. The image forming apparatus according to claim 8, further comprising a fan configured to generate an air current flowing from one side to another side of the circuit board, wherein a gap between the circuit board and the printed board gradually increases toward a downstream side from an upstream side of the air current.

14. The image forming apparatus according to claim 1, wherein another unit is disposed between the circuit board and the first frame.

15. The image forming apparatus according to claim 14, wherein the other unit includes a drive unit for transmitting a driving force to the forming unit.

16. The image forming apparatus according to claim 14, further comprising, between the other unit and the circuit board, a shielding member for covering the other unit.

17. The image forming apparatus according to claim 1, wherein the first frame has a projection protruding toward the circuit board at a position at which the circuit board faces the first frame.

18. The image forming apparatus according to claim 1, wherein the circuit board includes a low-voltage power supply board.

19. The image forming apparatus according to claim 1, further comprising a fan configured to generate an air current flowing from one side to another side of the circuit board, wherein a gap between the circuit board and the printed board gradually increases toward a downstream side from an upstream side of the air current.

20. The image forming apparatus according to claim 19, wherein the first electronic component is disposed on a downstream side of a center of the circuit board in a direction in which the air current flows.

21. The image forming apparatus according to claim 1, further comprising a feeding member configured to feed a recording material stacked on a stacking unit,
wherein the image forming unit includes a photosensitive member configured to rotate, and
when viewed in a direction perpendicular to a feeding direction in which the feeding member feeds the recording material and a rotational axis direction of the photosensitive member, the mounting surface is inclined with respect to the first frame.

22. The image forming apparatus according to claim 21, wherein, when viewed in the feeding direction, the mounting surface is inclined with respect to the first frame.

* * * * *